(12) United States Patent
Ogawa et al.

(10) Patent No.: US 6,362,507 B1
(45) Date of Patent: Mar. 26, 2002

(54) ELECTRO-OPTICAL DEVICES IN WHICH PIXEL SECTION AND THE DRIVER CIRCUIT ARE DISPOSED OVER THE SAME SUBSTRATE

(75) Inventors: Hiroyuki Ogawa; Kazuhide Tomiyasu, both of Nara; Ritsuko Kawasaki, Kanagawa; Hidehito Kitakado, Hyogo; Kenji Kasahara, Kanagawa; Shunpei Yamazaki, Tokyo, all of (JP)

(73) Assignees: Semiconductor Energy Laboratory Co., Ltd.; Sharp Kabushiki Kaisha, both of (JP)

( * ) Notice: Subject to any disclaimer, the term of this patent is extended or adjusted under 35 U.S.C. 154(b) by 0 days.

(21) Appl. No.: 09/550,828

(22) Filed: Apr. 18, 2000

(30) Foreign Application Priority Data

Apr. 20, 1999 (JP) .............................. 11-111592

(51) Int. Cl.[7] .................... H01L 27/03; H01L 27/12; H01L 31/0392
(52) U.S. Cl. .................... 257/350; 257/59; 257/72; 257/351
(58) Field of Search .................... 257/59, 72, 350, 257/351

(56) References Cited

U.S. PATENT DOCUMENTS 6,166,397 A * 12/2000 Yamazaki et al. ............ 257/59

6,166,414 A * 12/2000 Miyazaki et al. ............ 257/369
6,259,120 B1 * 7/2001 Zhang et al. ................ 257/72

FOREIGN PATENT DOCUMENTS

JP 6-236998 * 8/1993
JP 7-130652 5/1995

OTHER PUBLICATIONS

Hatano, M. et al, "A Novel Self–Aligned Gate–Overlapped LDD Poly–si TFT with High Reliability and Performance," *IEDM Tech*nical Digest 97, pp. 523–526, 1997.

English abstract re Japanese patent application No. 7–130652, published May 19, 1995.

* cited by examiner

*Primary Examiner*—Ngân V. Ngô
(74) *Attorney, Agent, or Firm*—Cook, Alex, McFarron, Manzo, Cummings & Mehler, Ltd.

(57) ABSTRACT

An object of the present invention is to improve the reliability and the operation performance of a semiconductor device comprising a driver circuit and a pixel pixel section by optimizing the TFT structure disposed in each circuit in accordance with the function of the circuit. The optimized circuit operation can be obtained by providing a LDD region that overlaps with at least the gate electrode in the driver circuit n-channel TFT, and a LDD region in the pixel section n-channel TFT in which the impurity concentration of the both LDD regions are differed.

30 Claims, 24 Drawing Sheets

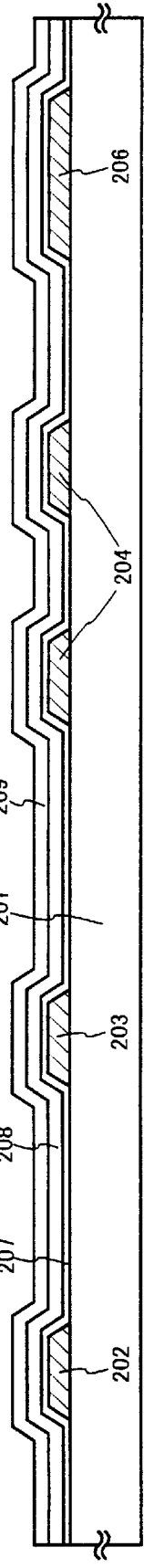
Fig. 2A formation of gate wiring, gate insulating film and semiconductor layer
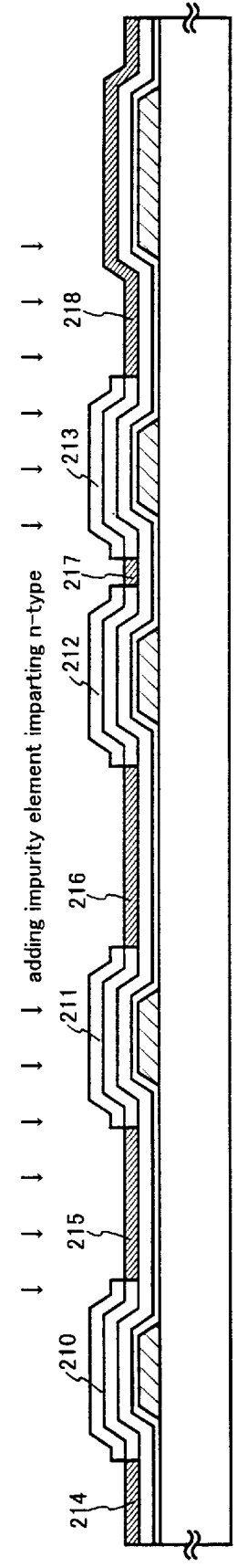
Fig. 2B formation of spacer film and formation of n+ region
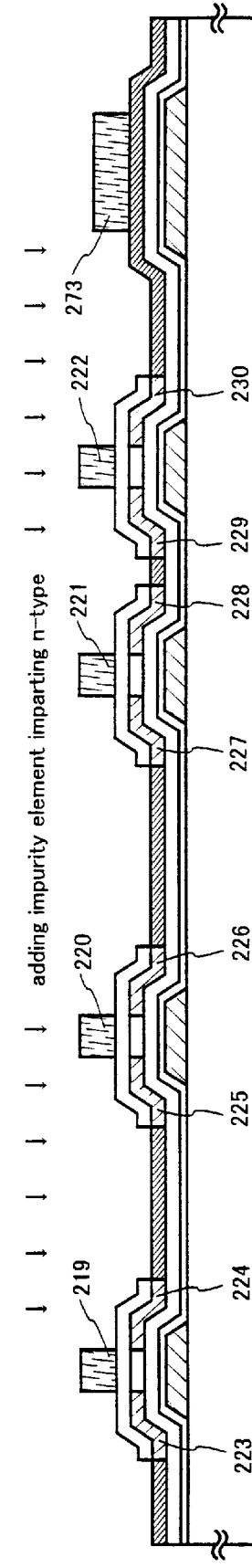
Fig. 2C formation of masks for channel protection and formation of n-- region

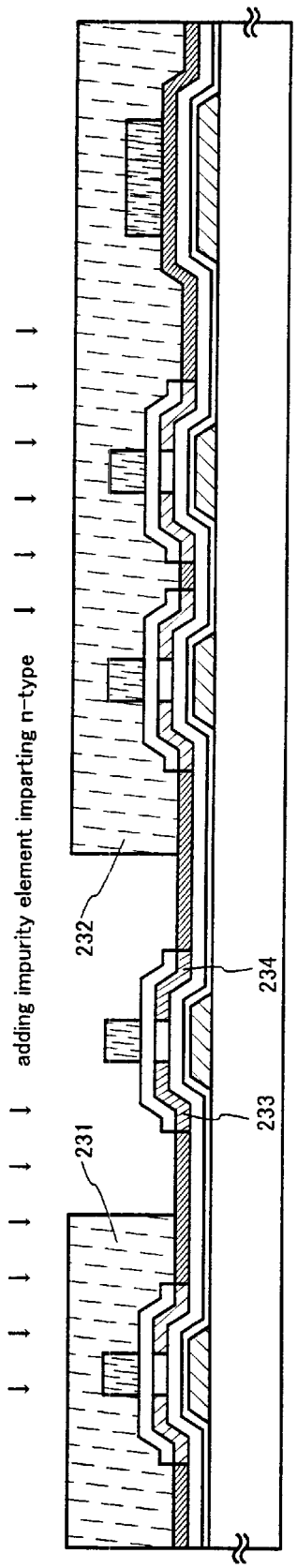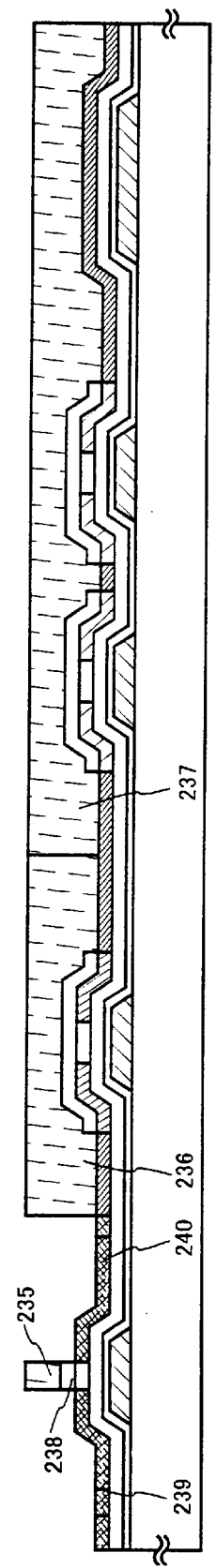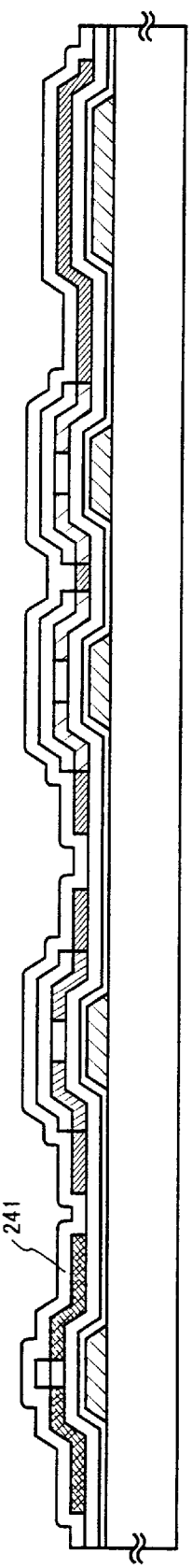

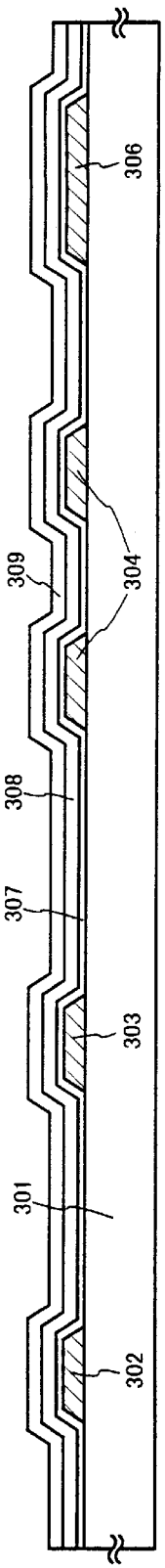
Fig. 5A formation of gate wiring, gate insulating film and semiconductor layer
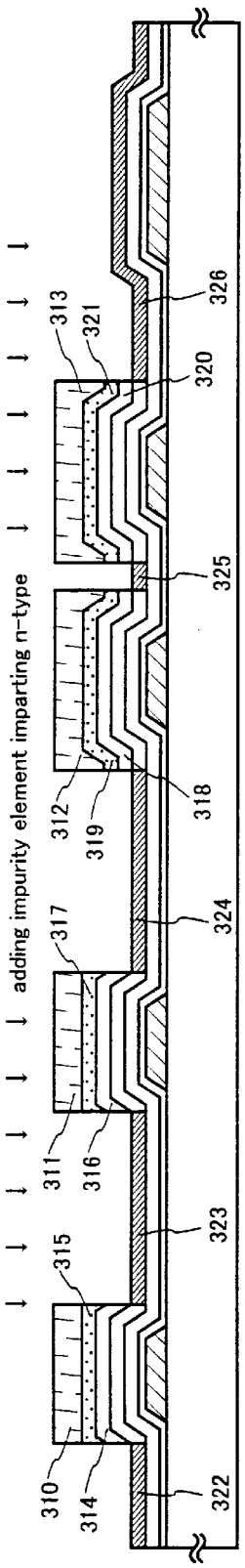
Fig. 5B formation of the first spacer film, the second spacer film and n+ region
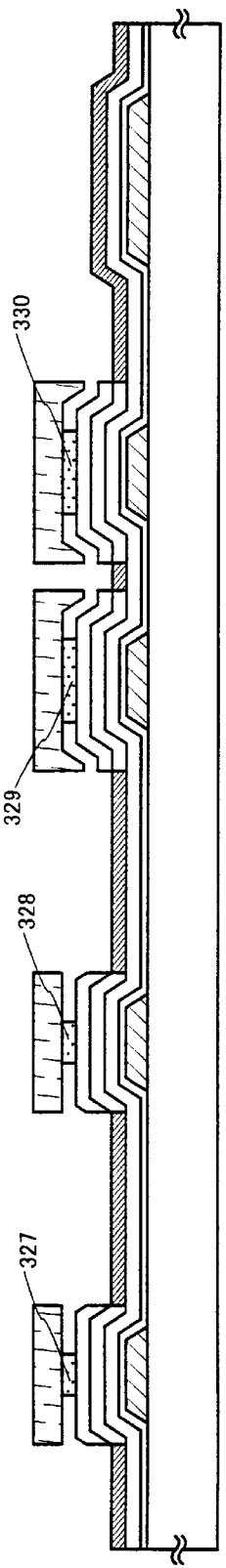
Fig. 5C selective etching of the second spacer

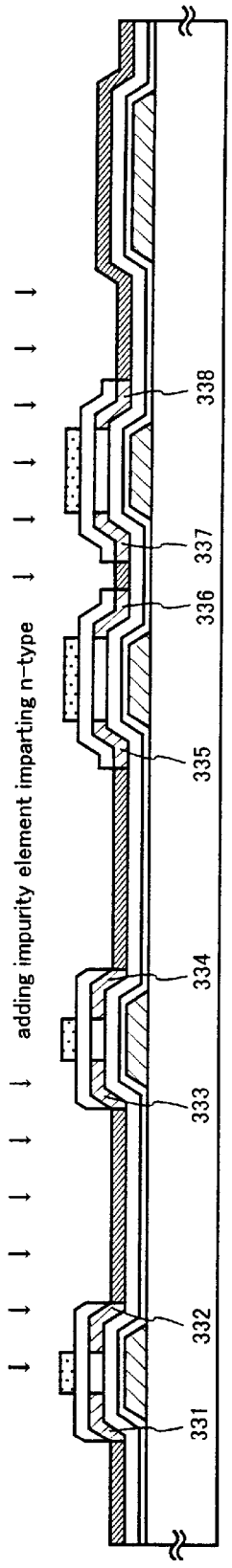
Fig. 6A formation of n-- region
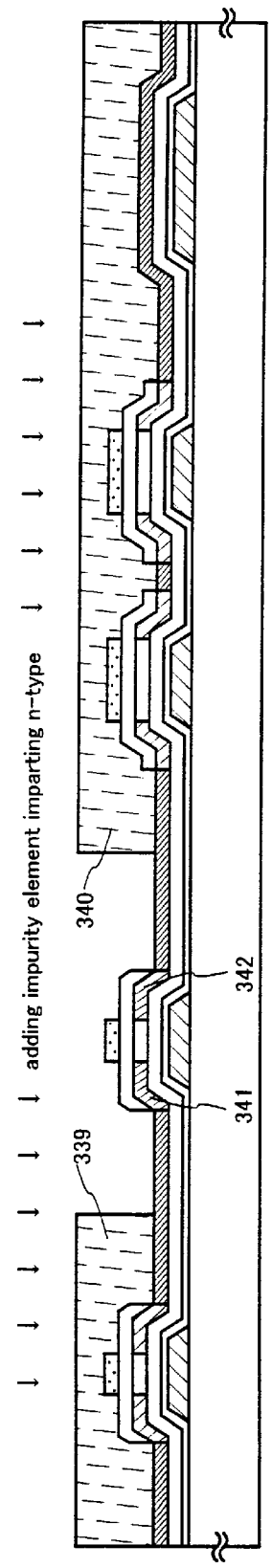
Fig. 6B formation of n- region
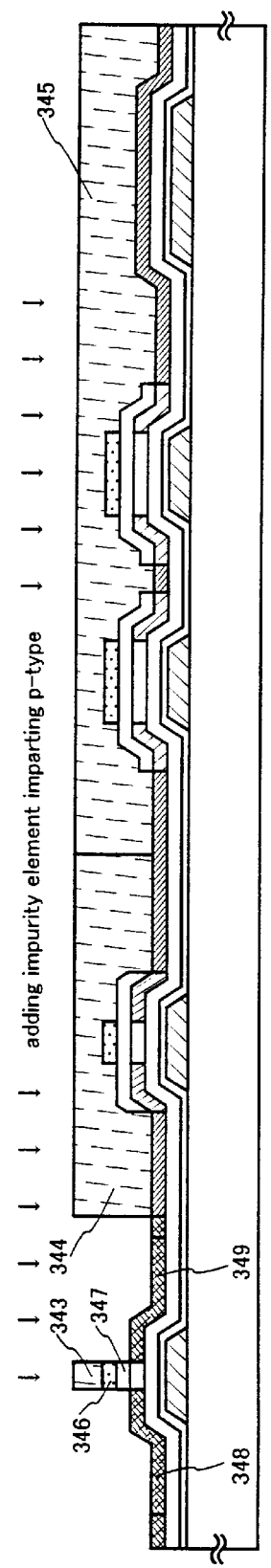
Fig. 6C formation of p+ region

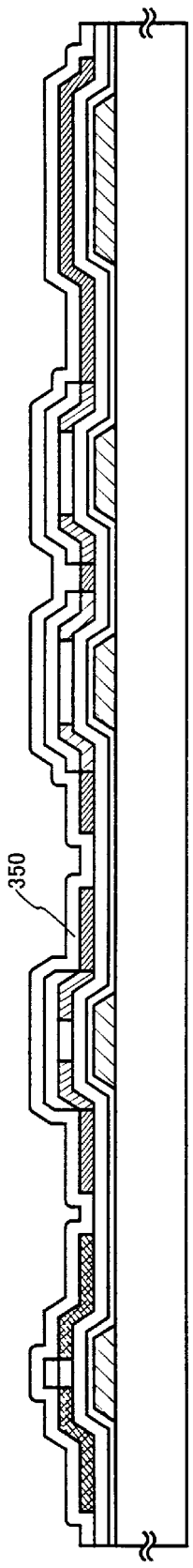
Fig. 7A process for formation of interlayer insulating film, activation of added impurity, and hydrogenation
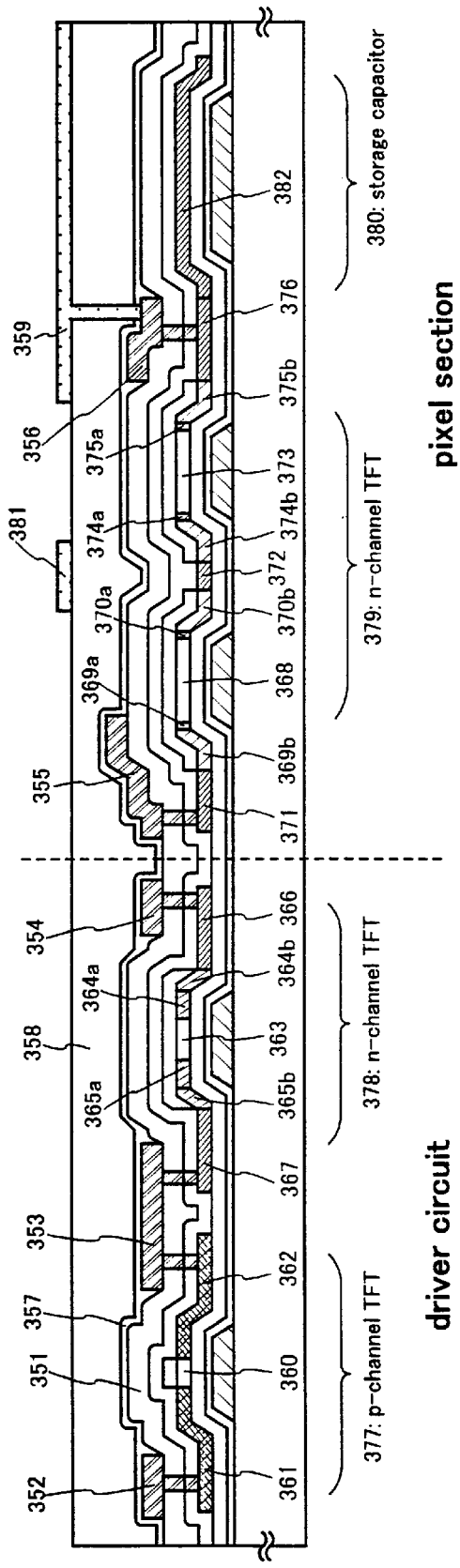
Fig. 7B formation of interlayer insulating film, source and drain wiring, passivation film and pixel electrode

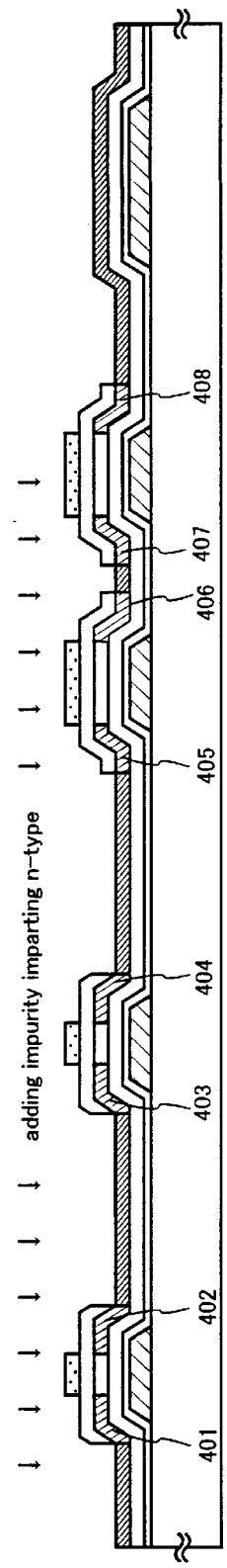
Fig. 8A formation of n− region
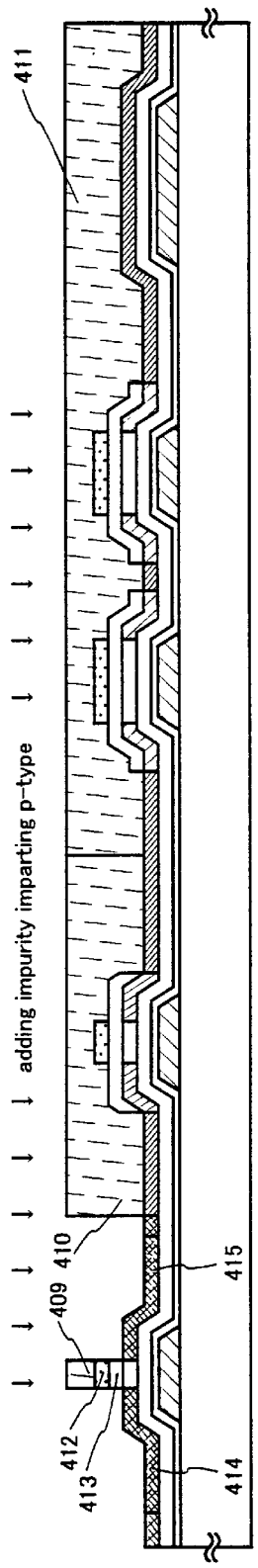
Fig. 8B formation of p+ region
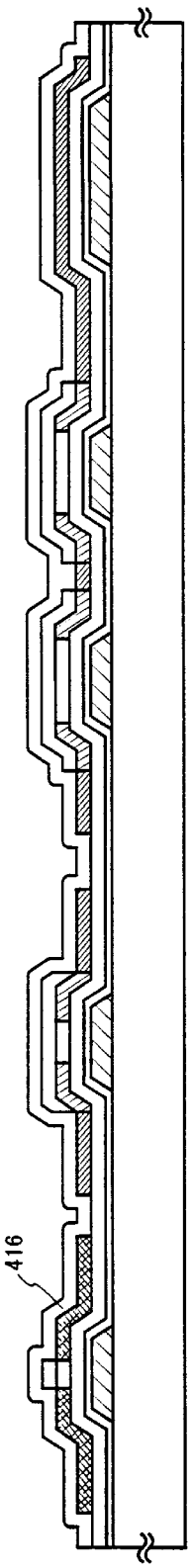
Fig. 8C processes for formation of interlayer insulating film, activation of added impurity and hydrogenation

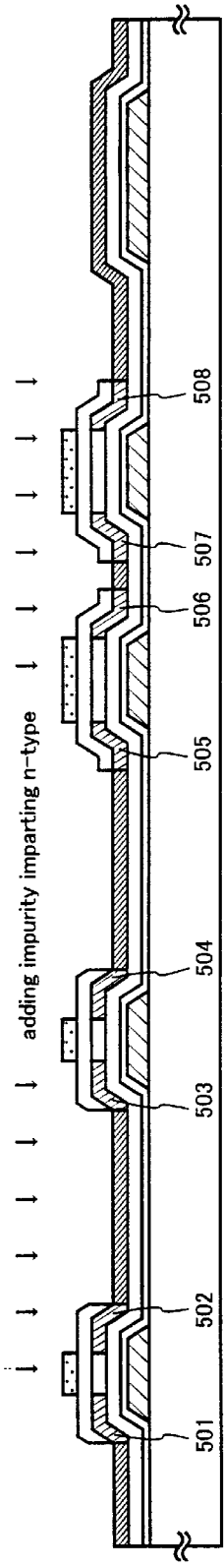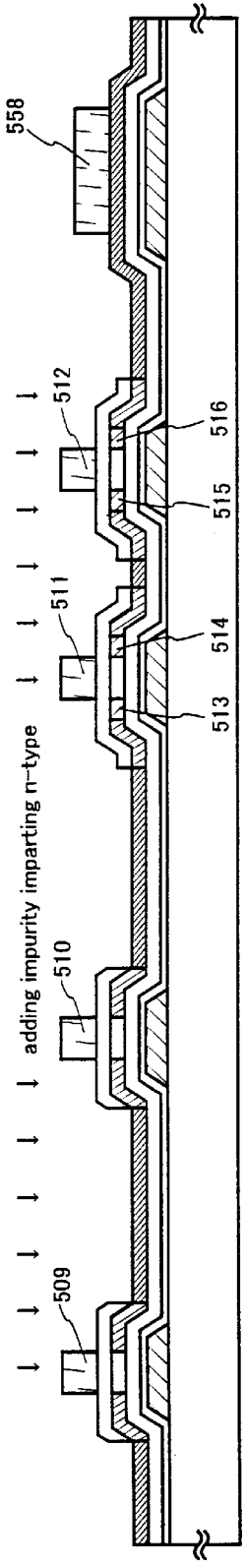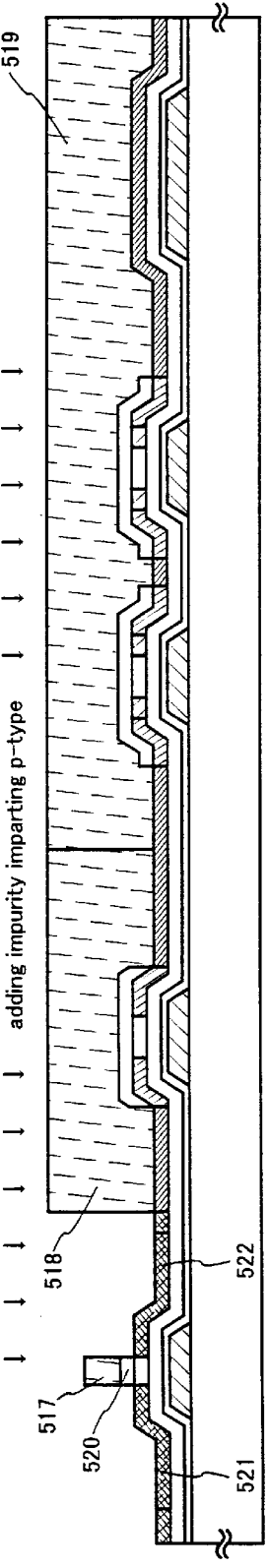

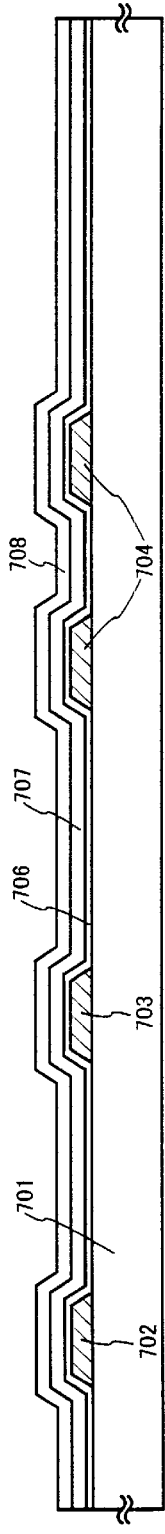
13A formation of gate wiring, gate insulting film and semiconductor layer
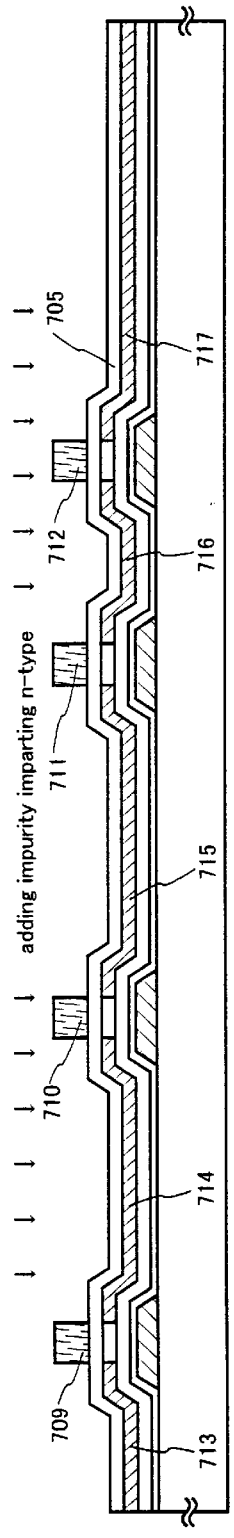
13B formation of spacer film and n⁻⁻region
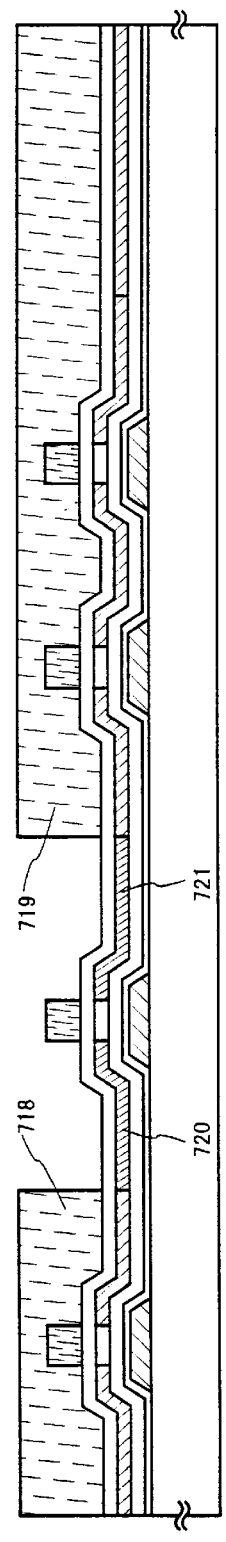
13C formation of n⁻ region

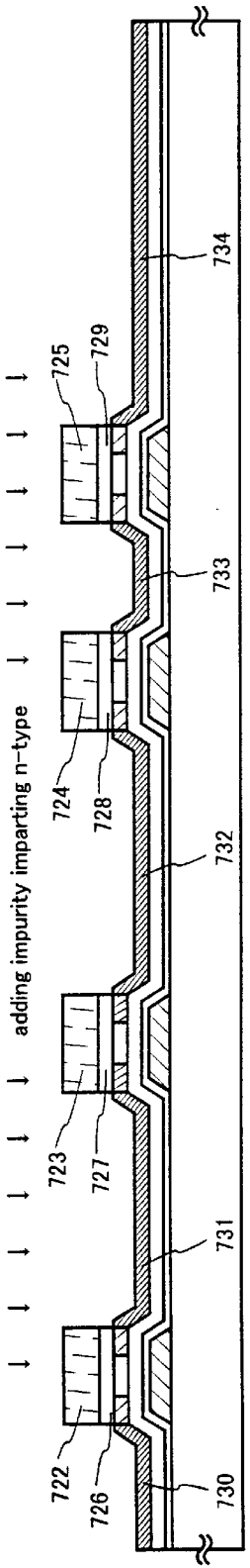
Fig. 14A etching the spacer film and formation of n+ region
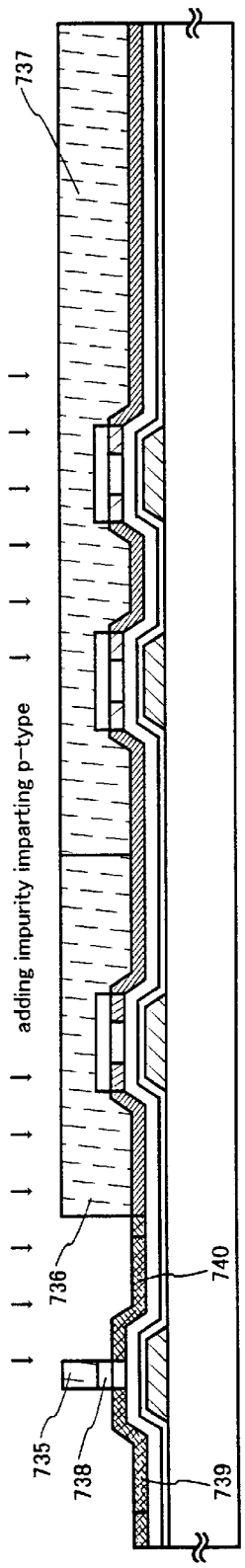
Fig. 14B etching the spacer film and formation of p+ region
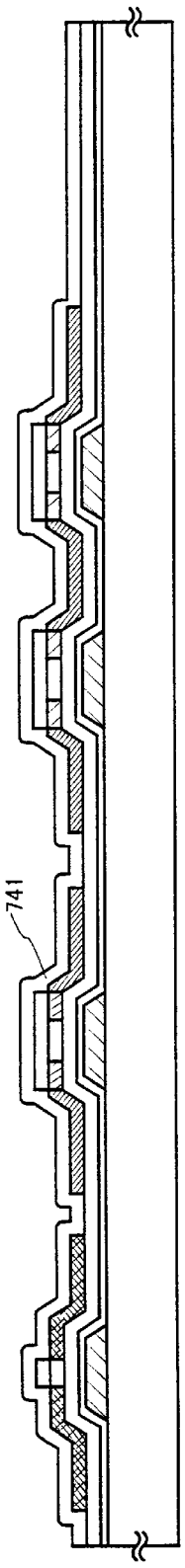
Fig. 14C formation of interlayer insulating film, activation of added impurity and hydrogenation Fig. 16A
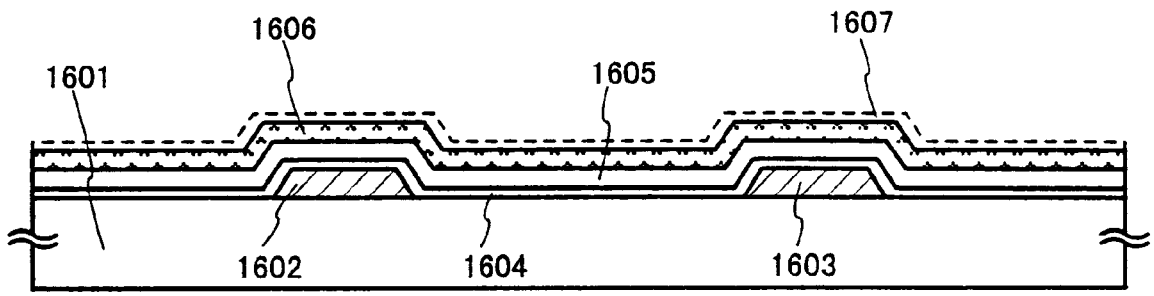
Fig. 16B  dehydrogenation, thermal crystallization
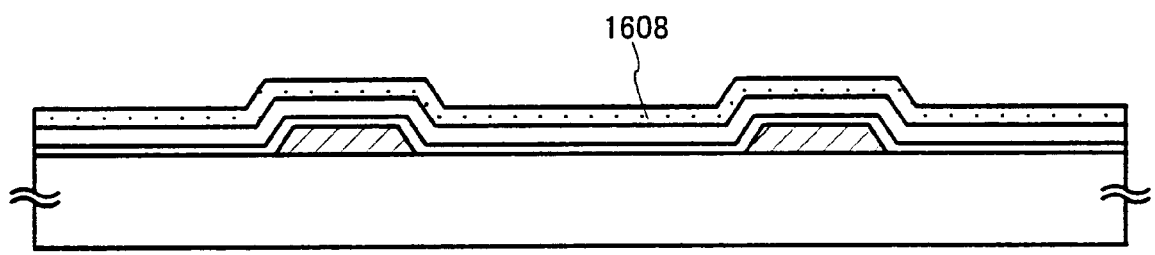
Fig. 16C  laser crystallization
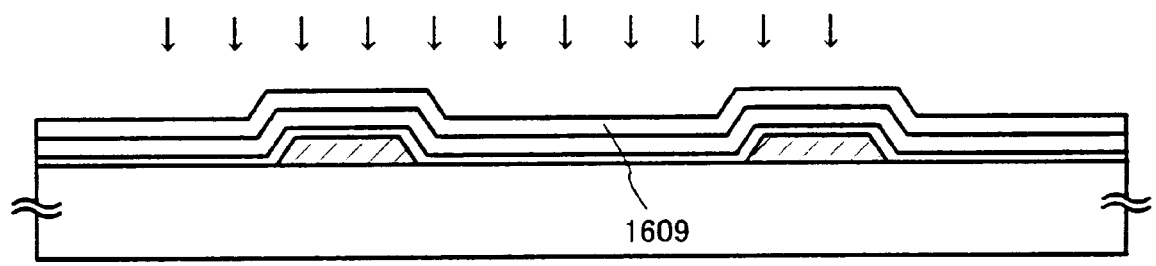

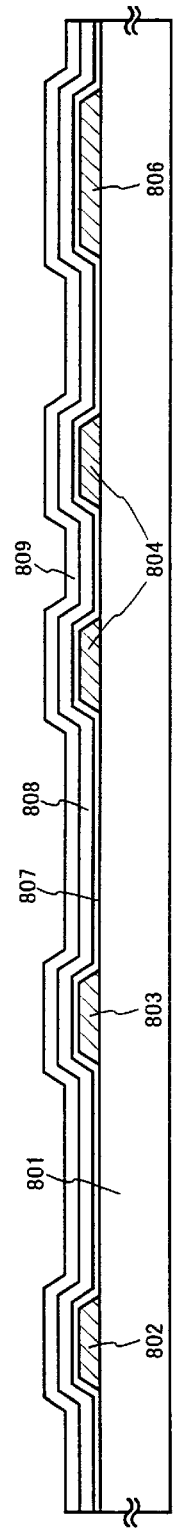
Fig. 17A formation of gate wiring, gate insulating film and semiconductor layer
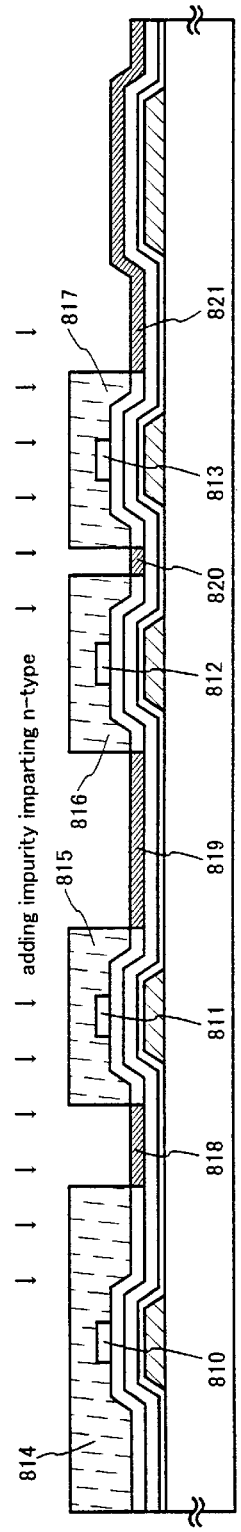
Fig. 17B formation of spacer film and n+ region
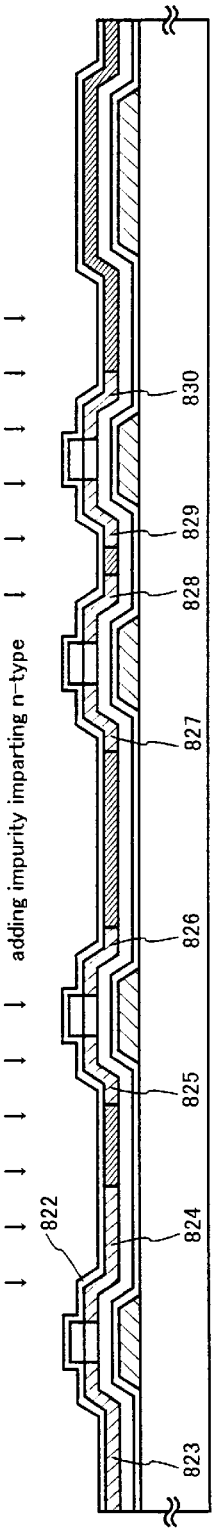
Fig. 17C formation of masks for channel protection, and n-- region

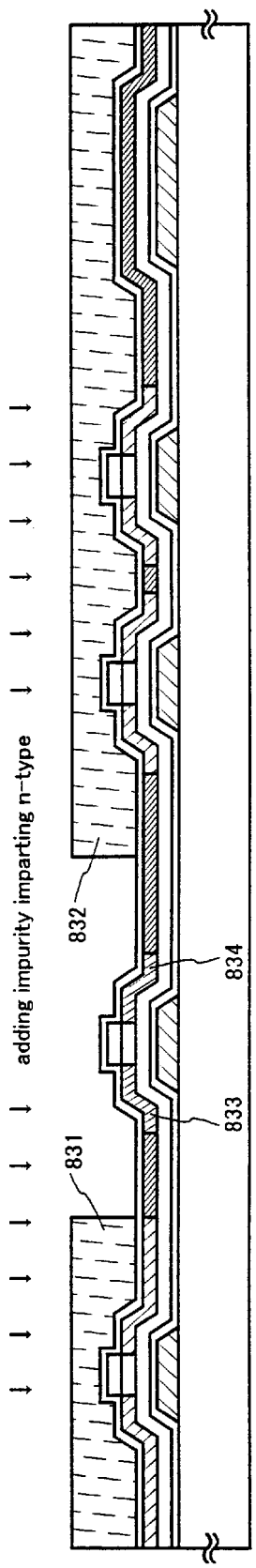
Fig. 18A formation of n− region
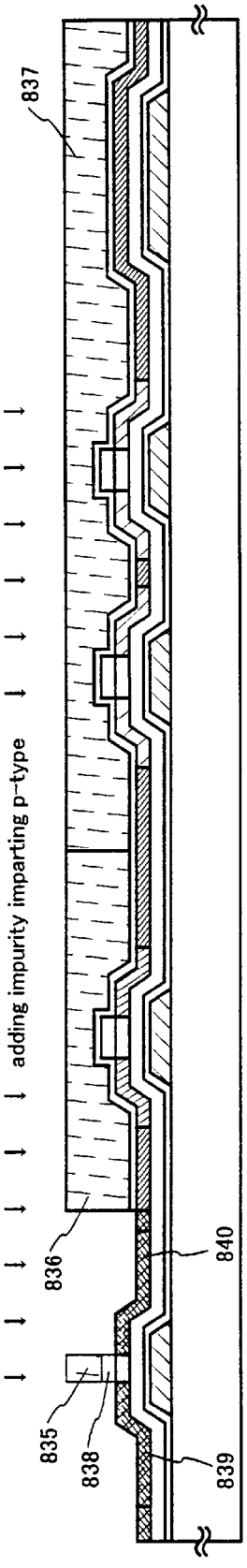
Fig. 18B formation of p+ region
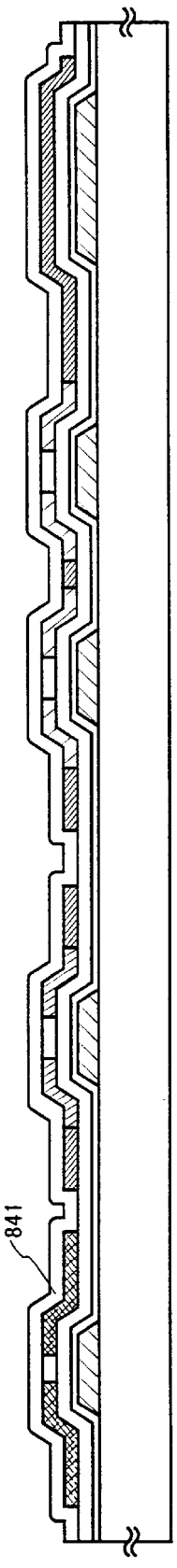
Fig. 18C formation of interlayer insulating film, activation of added impurity and hydrogenation Fig. 24A
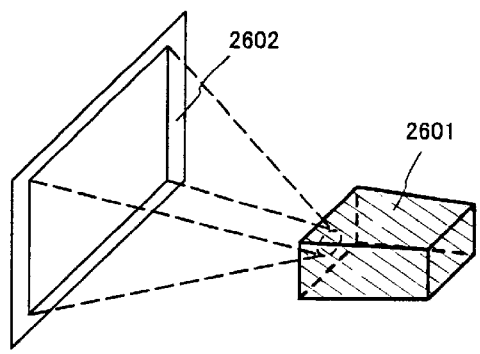
Fig. 24B
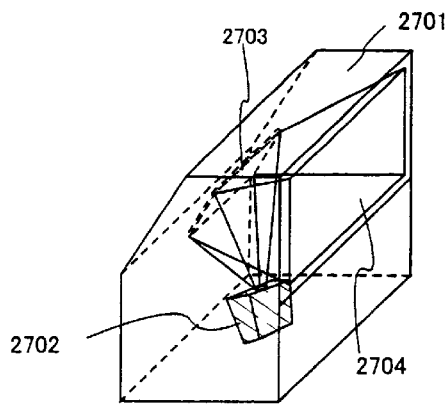
Fig. 24C   optical light source system and display device (3-plate type)
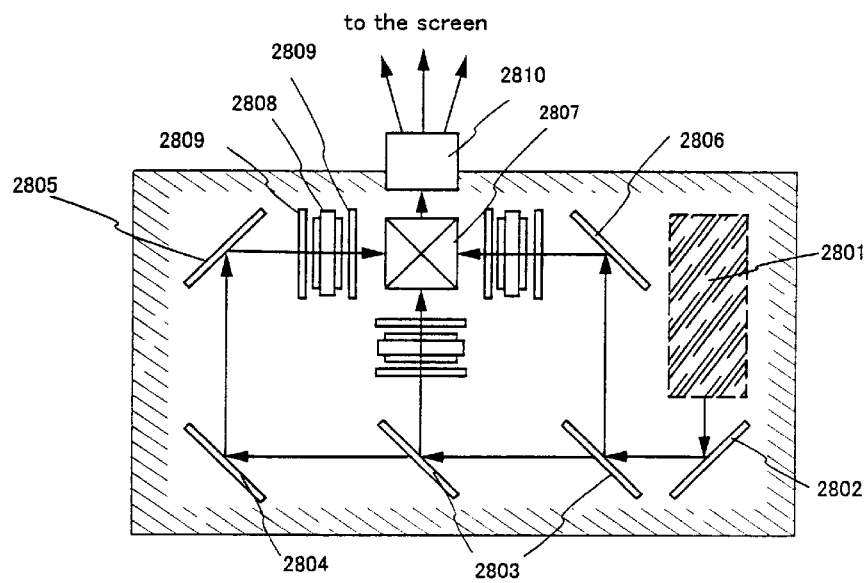
Fig. 24D optical light source system
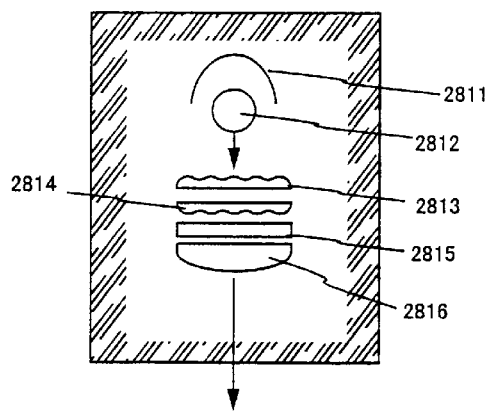

ELECTRO-OPTICAL DEVICES IN WHICH PIXEL SECTION AND THE DRIVER CIRCUIT ARE DISPOSED OVER THE SAME SUBSTRATE

BACKGROUND OF THE INVENTION

1. Field of the Invention

The present invention relates to a semiconductor device having a circuit structured-by a thin film transistor (hereinafter referred to as TFT), and to a method of manufacturing the same. Specifically the present invention is suitably utilized in electro-optical devices in which pixel section and the driver circuit provided in its peripheral are disposed over the same substrate, typified by a liquid crystal display device, and electronic equipment incorporating such electro-optical devices. Note that, throughout this specification, the semiconductor device indicates general devices that can function by using semiconductor characteristics, and that the electro-optical devices and electronic equipment incorporating the electro-optical devices are all categorized as semiconductor devices.

2. Description of the Related Art

Development of a semiconductor device having integrated circuit that comprises TFTs formed on a substrate having an insulation surface, has been made progressively. An active matrix type liquid crystal display device, an EL display device and a close adhesion type image sensor are known as typical examples. Particularly because TFTs using a crystalline silicon film as an active layer (the TFT will be hereinafter referred to as "crystalline silicon TFT") have high electric field mobility, they can form a variety of functional circuits, and the electro-optical devices integrally forming these over a same substrate are developed.

In the active matrix type liquid crystal display device, for example, a pixel section for displaying images and driver circuits that performs image display are provided. The driver circuit comprises a shift register circuit, a level shifter circuit, a buffer circuit, a sampling circuit and so forth, each being based on a CMOS circuit, is formed on one substrate. In the case of the close adhesion type image sensor, a sample-and-hold circuit, a shift register circuit, a multiplexer circuit, and so forth, are formed.

Because these driving circuits do not always have the same operating condition, the characteristics required for the TFTs are different not a few. The pixel section comprises a pixel TFT formed from an n-channel TFT and an auxiliary storage capacitor, which applies voltage to the liquid crystal and drives the liquid crystals. Here, it is necessary to drive the liquid crystal by alternating current, and a system called "frame inversion driving" is widely applied. Accordingly, a required characteristics of the TFT is that an OFF current value (a drain current value that flows when a TFT is in the OFF operation) must be sufficiently lowered. In a buffer circuit of the driver circuit on the other hand, because a high driving voltage is applied, the TFT must have a high withstand voltage such that it does not undergo breakdown even when a high voltage is applied. In order to improve the current driving capacity, it is necessary to sufficiently secure the ON current value (the drain current value that flows when a TFT is in the ON operation).

However, there was a problem that the OFF current is likely to become high in the crystalline silicon TFT. Degradation such as the drop of the ON current value is observed in the crystalline silicon TFT in the same way as in MOS transistors used for ICs, or the like. It is presumed that the main cause is hot carrier injection, and the hot carriers generated by a high electric field in the proximity of the drain presumably invite this degradation.

An LDD (lightly doped drain) structure is known as a structure of the TFT for lowering the OFF current value. This structure forms an impurity region having a low concentration between a channel forming region and a source or drain region to which an impurity is doped in a high concentration. The low concentration impurity region is called the "LDD region".

A so-called "GOLD (gate-drain overlapped LDD) structure" is also known as a structure for preventing deterioration of the ON current value by hot carrier injection in which the LDD region is so arranged as to overlap with a gate wiring through a gate insulation film. By forming this structure, the high electric field in the proximity of the drain is relieved and hot carrier injection is prevented, and it is effective for preventing degradation phenomenon. For example, Mutsuko Hatano, Hajime Akimoto and Takeshi Sakai, IEDM97 Technical Digest, pp.523–526, 1997, discloses a GOLD structure formed by side walls formed from silicon, and it has been confirmed that this structure provides by far higher reliability than the TFTs having other structures.

However, the required characteristics of the pixel TFT of the pixel section and the required characteristics of the TFTs of the driver circuit such as the shift register circuit and the buffer circuit, are not always the same. For example, a large reverse bias voltage (a negative voltage in n-channel TFT) is applied to the gate wiring in the pixel TFT, but the TFT of the driving circuit is not fundamentally driven by the application of the reverse bias voltage. Further the operation speed of the former may be lower than $\frac{1}{100}$ of the latter.

The GOLD structure has a high effect for preventing the degradation of the ON current value, it is true, but is not free from the problem that the OFF current value becomes greater than the ordinary LDD structures. Therefore, it was not a preferable structure to be applied to a pixel TFT. On the contrary, the ordinary LDD structures have a high effect for restricting the OFF current value, but is not resistant to degradation due to hot carrier injection.

For these reasons, it is not always preferred to constitute all the TFTs by the same structure in the semiconductor devices having a plurality of integrated circuits such as the active matrix type liquid crystal display device.

SUMMARY OF THE INVENTION

The present invention is a technology for solving the above stated problems and, the present invention aims at improving operation performance and reliability of a semiconductor device by optimizing in accordance with the function of each circuit the structures of the TFT used for each circuit of the semiconductor device.

In order to solve the above stated problems, a constitution of the present invention is characterized as: in a semiconductor device which comprises: a pixel section comprising a n-channel TFT having an active layer, an LDD region provided in the active layer, a gate insulating film provided between the active layer and the substrate, a gate electrode provided between the gate insulating film and the substrate; and its driving circuit, wherein the semiconductor device is characterized in that: at least a portion or all of the LDD region of the n-channel TFT of the pixel section is disposed so as to overlap the gate electrode of the pixel section; LDD region of the n-channel TFT of the driving circuit is disposed so as to overlap the gate electrode of the n-channel TFT of the driving circuit; and an impurity element imparting n-type is included in the LDD region of the n-channel TFT of the driving circuit at a higher concentration than that included in the LDD region of the n-channel TFT of the pixel section.

Another constitution of the present invention is characterized as: in a semiconductor device which comprises: a pixel section comprising a n-channel TFT having an active layer, an LDD region provided in the active layer, a gate insulating film provided between the active layer and the substrate, a gate electrode provided between the gate insulating film and the substrate; and its driving circuit, wherein the semiconductor device is characterized in that: at least a portion or all of the LDD region of the n-channel TFT of the pixel section is disposed so as to overlap the gate electrode of the pixel section; at least a portion or all of the LDD region of the n-channel TFT of the driving circuit is disposed so as to overlap the gate electrode of the n-channel TFT of the driving circuit; and an impurity element imparting n-type is included in the LDD region of the n-channel TFT of the driving circuit at a higher concentration than that included in the the LDD region of the n-channel TFT of the pixel section.

Another constitution of the present invention is characterized as: in a semiconductor device which comprises: a pixel section comprising a n-channel TFT having an active layer, an LDD region provided in the active layer, a gate insulating film provided between the active layer and the substrate, a gate electrode provided between the gate insulating film and the substrate; and its driving circuit, wherein the semiconductor device is characterized in that: a first LDD region of the n-channel TFT of the pixel section is disposed so as to overlap the gate electrode of the pixel section; a second LDD region of the n-channel TFT of the pixel section is disposed so as not to overlap the gate electrode of the pixel section; at least a portion or all of the LDD region of the n-channel TFT of the driving circuit is disposed so as to overlap the gate electrode of the n-channel TFT of the driving circuit; and an impurity element imparting n-type is included in the LDD region of the n-channel TFT of the driving circuit at a higher concentration than that included in the the LDD region of the n-channel TFT of the pixel section. It is preferable that the impurity element imparting n-type is included in the LDD region of the n-channel TFT of the driving circuit and the second LDD region of the n-channel TFT of the pixel section at a concentration higher by 2 times or more and less than 10 times compared to that included in the first LDD region of the n-channel TFT of the pixel section.

Another constitution of the present invention is characterized as: in a semiconductor device which comprises: a pixel section comprising a n-channel TFT having an active layer, an LDD region provided in the active layer, a gate insulating film provided between the active layer and the substrate, a gate electrode provided between the gate insulating film and the substrate; and its driving circuit, wherein the semiconductor device is characterized in that: the LDD region of the n-channel TFT of the pixel section is disposed so as to overlap the gate electrode of the pixel section; the LDD region of the n-channel TFT of the driving circuit is disposed so as to overlap the gate electrode of the n-channel TFT of the driving circuit; and an impurity element imparting n-type is included in the LDD region of the n-channel TFT of the driving circuit at a higher concentration than that included in the the LDD region of the n-channel TFT of the pixel section.

In the constitutions of the present invention above, it is preferable that the impurity element imparting n-type is included in the LDD region of the n-channel TFT of the driving circuit at a concentration higher by 2 times or more and less than 10 times compared to that included in the LDD region of the n-channel TFT of the pixel section.

Further in the above stated constitutions of the present invention, a storage capacitor of the pixel section is characterized as formed from: a semiconductor layer that is connected to the active layer and that includes an impurity element imparting n-type; an insulating film provided between the semiconductor layer and the substrate; and a capacitance wiring provided between the insulating film and the substrate.

Regarding the manufacturing method for a semiconductor device, a constitution of the present invention is characterized as: in a manufacturing method for semiconductor device which comprises: a pixel section comprising a n-channel TFT having an active layer, an LDD region provided in the active layer, a gate insulating film provided between the active layer and the substrate, a gate electrode provided between the gate insulating film and the substrate; and its driving circuit, wherein the semiconductor device is characterized in that: at least a portion or all of the LDD region of an n-channel TFT of the pixel section is disposed so as to overlap the gate electrode of the n-channel TFT of the pixel section; LDD region of an n-channel TFT of the driving circuit is disposed so as to overlap the gate electrode of the n-channel TFT of the driving circuit; and an impurity element imparting n-type is included in the LDD region of the n-channel TFT of the driving circuit at a higher concentration than that included in the the LDD region of the n-channel TFT of the pixel section.

Another constitution of the present invention is characterized as: in a manufacturing method for semiconductor device which comprises: a pixel section comprising a n-channel TFT having an active layer, an LDD region provided in the active layer, a gate insulating film provided between the active layer and the substrate, a gate electrode provided between the gate insulating film and the substrate; and its driving circuit, wherein the semiconductor device is characterized in that: at least a portion or all of the LDD region of an n-channel TFT of the pixel section is disposed so as to overlap the gate electrode of the n-channel TFT of the pixel section; at least a portion or all of the LDD region of an n-channel TFT of the driving circuit is disposed so as to overlap the gate electrode of the n-channel TFT of the driving circuit; and an impurity element imparting n-type is included in the LDD region of the n-channel TFT of the driving circuit at a higher concentration than that included in the the LDD region of the n-channel TFT of the pixel section.

Another constitution of the present invention is characterized as: in a manufacturing method for semiconductor device which comprises: a pixel section comprising a n-channel TFT having an active layer, an LDD region provided in the active layer, a gate insulating film provided between the active layer and the substrate, a gate electrode provided between the gate insulating film and the substrate; and its driving circuit, wherein the semiconductor device is characterized in that: a first LDD region of an n-channel TFT of the pixel section is disposed so as to overlap the gate electrode of the n-channel TFT of the pixel section; a second LDD region of the n-channel TFT of the pixel section is disposed so as not to overlap the gate electrode of the n-channel TFT of the pixel section; at least a portion or all of the LDD region of an n-channel TFT of the driving circuit is disposed so as to overlap the gate electrode of the n-channel TFT of the driving circuit; and an impurity element imparting n-type is included in the LDD region of the n-channel TFT of the driving circuit and the second LDD region of the n-channel TFT of the pixel section at a higher concentration than that included in the first LDD region of the n-channel TFT of the pixel section. It is preferable that the impurity element imparting n-type is included in the LDD region of the n-channel TFT of the driving circuit and the second LDD region of the n-channel TFT of the pixel section at a concentration higher by 2 times or more and less than 10 times compared to that included in the first LDD region of the n-channel TFT of the pixel section.

Another constitution of the present invention is characterized as: in a manufacturing method for a semiconductor device which comprises: a pixel section comprising a n-channel TFT having an active layer, an LDD region provided in the active layer, a gate insulating film provided between the active layer and the substrate, a gate electrode provided between the gate insulating film and the substrate; and its driving circuit, wherein the semiconductor device is characterized in that: the LDD region of an n-channel TFT of the pixel section is disposed so as to overlap the gate electrode of the n-channel TFT of the pixel section; the LDD region of an n-channel TFT of the driving circuit is disposed so as to overlap the gate electrode of the n-channel TFT of the driving circuit; and an impurity element imparting n-type is included in the LDD region of the n-channel TFT of the driving circuit at a higher concentration than that included in the the LDD region of the n-channel TFT of the pixel section.

In the constitutions of the present invention above, it is preferable that the impurity element imparting n-type is included in the LDD region of the n-channel TFT of the driving circuit at a concentration higher by 2 times or more and less than 10 times compared to that included in the LDD region of the n-channel TFT of the pixel section.

Further in the above stated constitutions of the present invention, a storage capacitor of the pixel section is characterized as formed from: a semiconductor layer that is connected to the active layer and that includes an impurity element imparting n-type; an insulating film provided between the semiconductor layer and the substrate; and a capacitance wiring provided between the insulating film and the substrate.

BRIEF DESCRIPTION OF THE DRAWINGS

In the accompanying drawings:

FIGS. 2A to 2C are diagrams showing cross sectional views of a pixel section and a driver circuit in the manufacturing processes.

FIGS. 3A to 3C, are diagrams showing cross sectional views of a pixel section and a driver circuit in the manufacturing processes.

FIGS. 5A to 5C are diagrams showing cross sectional views of a pixel section and a driver circuit in the manufacturing processes.

FIGS. 6A to 6C. are diagrams showing cross sectional views of a pixel section and a driver circuit in the manufacturing processes.

FIGS. 7A and 7B are diagrams showing cross sectional views of a pixel section and a driver circuit in the manufacturing processes.

FIGS. 8A to 8C are diagrams showing cross sectional views of a pixel section and a driver circuit in the manufacturing processes.

FIGS. 10A to 10C are diagrams showing cross sectional views of a pixel section and a driver circuit in the manufacturing processes.

FIGS. 13A to 13C are diagrams showing cross sectional views of a pixel section and a driver circuit in the manufacturing processes.

FIGS. 14A to 14C are diagrams showing cross sectional views of a pixel section and a driver circuit in the manufacturing processes.

FIGS. 16A to 16C are cross sectional views showing manufacturing processes of a crystalline semiconductor layer.

FIGS. 17A to 17C are diagrams showing cross sectional views of a pixel section and a driver circuit in the manufacturing processes.

FIGS. 18A to 18C are diagrams showing cross sectional views of a pixel section and a driver circuit in the manufacturing processes.

FIGS. 24A to 24D are diagrams showing an example of the semiconductor device.

DETAILED DESCRIPTION OF THE PREFERRED EMBODIMENTS

Embodiment Mode

Figure 1:
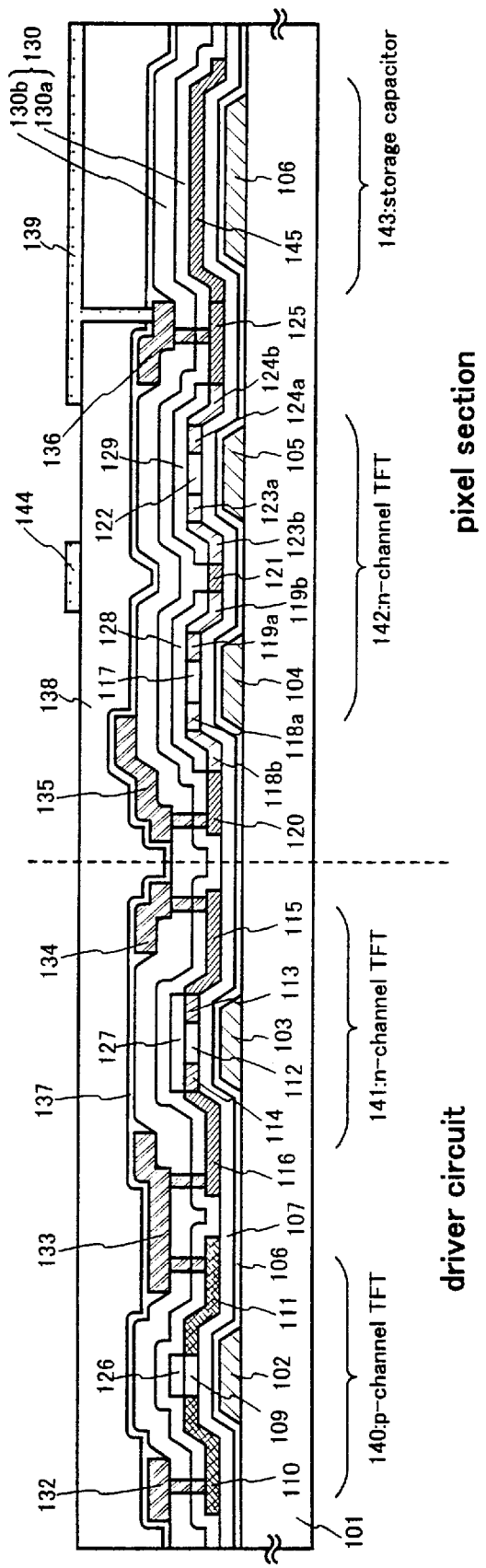
FIG. 1 is a diagram showing a cross section of the pixel section and the driver circuit according to the present embodiment mode.

An embodiment mode of the present invention is described by using FIG. 1. FIG. 1 shows a cross sectional structure of TFTs of a pixel section and a driver circuit formed over a same substrate.

A substrate 101 has an insulating surface, and it is possible to utilize a metallic substrate, a silicon substrate or a ceramics substrate on surface of which an insulating film was formed, other than insulating substrates such as a glass substrate, a quartz substrate, a plastic substrate, etc. For a glass substrate, it is preferable to apply a low alkali glass substrate typified by, for example, #1737 substrate manufactured by Corning, Inc. It is further preferable if an insulating film comprising silicon oxide or silicon nitride as the main component is formed adherent to the surface.

N-channel TFT 142 of the pixel section, storage capacitor 143 and n-channel TFT 141 and p-channel TFT 140 of the driver circuit are formed over the substrate 101.

Gate electrodes 102 to 105 are formed from a material comprising one or plural kinds of elements selected from a group consisting of aluminum (Al), titanium (Ti), tantalum (Ta), chromium (Cr), molybdenum (Mo), tungsten (W), nickel (Ni) and copper (Cu), and formed into a pattern to have a taper shaped edge. Further though not shown in the figures, a laminate structure of the materials may also be applied. For instance, double layered structure of tantalum nitride (TaN) and Ta may be formed in this order from the substrate. Still further, an oxide may be formed by anodic oxidation etc. to cover the surface of the gate electrodes.

A gate insulating film that is formed to cover the gate electrodes is formed from a silicon nitride film 106 and a silicon oxide film 107. Though a double layered structure is shown here, it may be a single layered structure, and further it is not necessary to limit to said materials. The thickness of the gate insulating film may be 20 to 200 nm, preferably 150 to 200 nm.

After forming gate electrodes and a gate insulating film in this order from the substrate 101, a crystalline semiconductor film is applied for the active layer and formed into islands. Though there is no limitation to the fabrication method for the crystalline semiconductor film, it is most preferable to use a crystalline silicon film fabricated by a technique in which amorphous silicon film is crystallized by laser crystallization or thermal crystallization, or a technique for crystallization which uses a catalyst element that promotes crystallization of amorphous silicon. Needless to say, it is possible to substitute other semiconductor materials for silicon. The thickness of the active layer is formed into 20 to 150 nm, preferably 30 to 75 nm.

A channel forming region 109, a source region 110 and a drain region 111 are formed in the active layer of the p-channel TFT 140 of the driver circuit. A channel forming region 112, a source region 115, a drain region 116 and LDD regions 113 and 114 are formed in the active layer of n-channel TFT 141. An impurity element imparting n-type is included in these LDD regions 113 and 114 in a concentration of $5\times10^{17}$ to $5\times10^{18}$ cm$^{-3}$. An element well known in the field of semiconductor technology may be used for the impurity element imparting n-type, typically phosphorus (P) or arsenic (As) etc may be used. It is a GOLD structure in which LDD regions 113 and 114 are provided so as to overlap the gate electrode 103 by interposing a gate insulating film.

Channel forming regions 117 and 122, source or drain regions 120, 121 and 125, and LDD regions 118a, 118b, 119a, 119b, 123a, 123b, 124a and 124b are provided in the active layer of n-channel TFT 142 in the pixel section. The concentration of impurity element imparting n-type in these LDD regions may be in a range of from $1\times10^{17}$ to $2.5\times10^{18}$cm$^{-3}$, but it is preferable to set the concentration to ½ to ⅕₀ of the impurity concentration in the LDD regions 113 and 114 of the n-channel TFT of the driver circuit.

LDD regions of the n-channel TFTs in the driver circuits are provided for a principal object of preventing degradation of ON current value due to hot carrier injection, by relieving high electric field in the vicinity of drain. An appropriate concentration of the impurity element imparting n-type may therefore be $5\times10^{17}$ to $5\times10^{18}$ cm$^{-3}$. On the contrary an LDD region of n-channel TFT in the pixel section is provided for the main purpose of reducing the OFF current value.

The length of the LDD region that overlaps the gate electrode (hereinafter referred to as Lov region. Note that "ov" means overlap.) of an n-channel TFT in the driver circuit may be between 0.5 and 3.0 μm, typically from 1.0 to 1.5 μm, for a channel length of 3 to 8 μm. Further, the length of the LDD regions that do not overlap the gate electrode (hereinafter referred to as Loff region. Note that "off" means offset.) of n-channel TFT in the pixel section, in the direction of channel length, may be from 0.5 to 3.5 μm, typically between 1.5 and 2.5 μm.

Channel protection layers 126 to 129 are formed from silicon oxide film etc. These may be removed before forming the first interlayer insulating film 130 though these may be left on the active layers as shown in the figure. The first interlayer insulating film 130 may be formed from silicon nitride film, silicon oxide film or silicon nitride oxide film or from a laminate structure combining these. For example, it can be a silicon nitride oxide film 130a and a silicon oxide film 130b. Further the thickness of the first interlayer insulating film may be 500 to 1500 nm.

Contact holes reaching source or drain of each TFT are formed in the first interlayer insulating film, and source wirings 132, 134, and 135 and drain wirings 133 and 136 are formed.

Though not shown in the figure, the wiring may be formed from a triple layered laminate structure in which Ti film is formed into 150 nm, Al film containing Ti is formed into 300 nm and Ti film is formed into 100 nm.

A passivation film 137 is formed into 30 to 500 nm thickness typically 50 to 200 nm from silicon nitride film, silicon oxide film or silicon nitride oxide film. A second interlayer insulating film 138 is formed into a thickness of approximately 1000 nm. The second interlayer insulating film may be formed by using an organic resin film such as polyimide, polyamide, acrylic, polyimide amide, benzocyclobutene, etc. The following points can be given as the benefits of using an organic resin film: easy film deposition; the parasitic capacitance can be reduced because the specific dielectric constant is low; and superior levelness. For instance, when a thermal polymerization type polyimide is used, it can be formed at approximately 300° C. Note that it is possible to use other organic resin films from those stated above, or organic silicon oxide compounds.

In a pixel section, a contact hole reaching drain wiring 136 is formed into the second interlayer insulating film 138 and the passivation film 137 and pixel electrodes 139 and 144 are formed. A transparent conductive film may be used for the pixel electrode in case of transmissive type display device and a metallic film may be used for forming a reflection type display device. Appropriate materials for the transparent conductive film are indium oxide (In$_2$O$_3$), tin oxide (SnO$_2$) and zinc oxide (ZnO) etc, and typically the film is formed by using indium tin oxide (ITO) film.

By such constitution an active matrix substrate comprising a pixel section and a driver circuit over a same substrate is formed. In the driver circuit n-channel TFT 141 and p-channel TFT 140 are formed, and it is also possible to form a logic circuit based on CMOS circuits. N-channel TFT 142 is formed in a pixel section, and a storage capacitor 143 comprising a capacitance wiring 106 formed at the same time with the gate electrode, an insulating film formed from the same material as the gate insulating film, and a semiconductor layer 145 that is connected to source or drain region 125 and in that impurity element imparting n-type is added, is formed.

As stated above, the present invention made it possible to improve the operation performance and reliability of a semiconductor device by optimizing the TFT structure that constitute each circuit in accordance with the specifications that pixel section and the driver circuit require. In concrete, design of LDD region in the n-channel TFTs are respectively varied according to each circuit specification and by suitably disposing Lov region or Loff region, a TFT structure imposing importance on hot carrier counter measure and a TFT structure imposing importance on low OFF current value, are realized over a same substrate.

EMBODIMENTS

Embodiment 1

An embodiment of the present invention is described by using FIGS. 2A to 4. A method for manufacturing TFTs of the pixel section and the driver circuit provided in its peripheral are described in detail by following the steps.
(Formation of Gate Electrode, Gate Insulating Film and Semiconductor Layer: FIG. 2A)

In FIG. 2A, a low alkali glass substrate or a quartz substrate was used for the substrate 201. An underlayer film such as a silicon oxide film, silicon nitride film or silicon nitride oxide film may be formed on the surface of the substrate 201 on which TFTs are formed. (not shown)

The gate electrodes 202 to 204 are formed by depositing a film by a publicly known deposition method such as sputtering or vacuum evaporation etc. using an element selected from Ta, Ti, W and Mo or a material whose main component are one of these elements, and then forming patterns by etching to have tapered edge. For instance, a desirable shape can be formed when a Ta film was formed into 200 nm thickness by sputtering, and then plasma etching was performed thereon with mixed gas of $CF_4$ and $O_2$ after forming a resist mask of a preset shape. The gate electrode may be formed into double layered structure of TaN and Ta, or tungsten nitride (WN) and W. (not shown in the Figure) A capacitance wiring 206 and a gate wiring connected to the gate electrode (not shown) are similarly formed at the same time.

Gate insulating film is formed into 10 to 200 nm preferably 150 to 200 nm with a material whose main component is silicon oxide or silicon nitride. For example the gate insulating film may be formed by forming by plasma CVD a lamination of a 25 nm thickness silicon nitride film 207 with raw materials of $SiH_4$, $NH_3$ and $N_2$, and a silicon nitride oxide film 208 of 125 to 175 nm thickness with raw materials of $SiH_4$ and $N_2O$. Further, in order to obtain a clean surface, plasma hydrogen treatment may be performed before gate insulating film deposition.

An amorphous silicon film is next formed in close contact with the gate insulating film by a known deposition method such as plasma CVD or sputtering etc into 20 to 150 nm thick. Though the manufacturing conditions for the amorphous silicon film is not specifically limited, it is preferable to sufficiently reduce the impurity elements included in the film, such as oxygen or nitrogen etc. Since it is possible to form the gate insulating film and the amorphous silicon film by a same deposition method, the two may be formed in succession. The contamination on the surface can be prevented by not exposing to the aerial atmosphere after forming the gate insulating film, so that scattering of fabricated TFT characteristic and deviation of the threshold voltage can be reduced. There is no specific limitation to the fabrication method for the crystalline silicon film, and the crystalline silicon film 209 can be formed by using a publicly known crystallization technology. For instance, laser anneal using a laser light having wavelength of 400 nm or less can be applied as a laser crystallization technology, or thermal crystallization (solid phase growth method) in which crystallization is performed in a temperature from 600 to 650° C. can be applied.

In the crystalline silicon film 209, boron (B) of approximately $1\times10^{16}$ to $5\times10^{17}$ may be added to a region where n-channel TFT is formed for the purpose of controlling the threshold voltage. Ion doping may be performed for adding boron (B), or it may be added at the same time with depositing amorphous silicon film.
(formation of spacer film and n⁻ region: FIG. 2B)

Formation of impurity regions that function as a source region or a drain region of an n-channel TFT is next performed. For that purpose, a silicon oxide film or a silicon nitride film is formed on the entire surface of the crystalline silicon film 209, and by removing unnecessary potions, spacer films 210 to 213 are formed. Impurity regions 214 to 218 are then formed in the crystalline silicon film by adding an impurity element imparting n-type with these spacer films as a mask. This is performed by ion doping (ion implantation is also usable) using phosphine ($PH_3$), and phosphorus (P) concentration of these regions is set at between $1\times10^{20}$ to $1\times10^{21}$ $cm^{-3}$. In this specification, concentration of the impurity element imparting n-type included in the impurity regions 214 to 218 formed here is denoted as (n⁺).
(formation of channel protecting mask, formation of n⁻ region: FIG. 2C)

In order to form LDD regions of n-channel TFT in the pixel section, process for adding impurity that imparts n-type is performed. Photo resist film is formed here on the entire surface and patterning treatment by exposure of light from the back side is performed. Gate electrodes 202 to 204 functioned the similar role as a photo mask and channel protecting masks 219 to 222 are formed in a selfaligned manner at sections where channel forming region is formed over the gate electrodes.

Impurity element imparting n-type was added to the crystalline silicon film under the spacer films through the spacer films here by ion doping. The phosphorus (P) concentration in thus formed impurity regions 223 to 230 is set between $1\times10^{17}$ and $2.5\times10^{18}$ $cm^{-3}$. In this specification, concentration of the impurity element imparting n-type included in the impurity regions 223 to 230 formed here is denoted as (n⁻).
(formation of n⁻ region: FIG. 3A)

LDD regions of n-channel TFT for the driver circuit is similarly formed by ion doping through spacer films. In this case, resist masks 231 and 232 are formed beforehand in order not to affect at least the impurity regions 227 to 230 of the pixel section formed in the former process. The phosphorus (P) concentration of the impurity regions 233 and 234 formed is set in a range from $2\times10^{17}$ and $5\times10^{18}cm^{-3}$, and this is twice or more, and less than 10 times as much as the concentration of n⁻. In this specification, concentration of the impurity element imparting n-type included in the impurity regions 233 and 234 formed here is denoted as (n⁻).
(formation of p⁺ region: FIG. 3B)

A process for adding impurity element imparting p-type was performed in order to form source region and drain region of p-channel TFTs in the driver circuit. In order to decide the channel forming region of the p-channel TFT, a new resist mask 235 is formed here on top of the spacer film 210, and a new spacer film 238 is formed by performing etching treatment onto the spacer film. Regions where n-channel TFTs are formed are covered with resist masks 236 and 237. Impurity regions 239 and 240 are then formed by ion doping (ion implantation may be used too) using diborane ($B_2H_6$). The boron (B) concentration in this region is set at $1.5\times10^{20}$ to $3\times10^{21}$ cm$^{-3}$. In this specification, concentration of impurity element imparting p-type in impurity regions 239 and 240 formed here is denoted as (p$^+$). Note that though regions where phosphorus (P) is mixed is formed in a part of impurity regions 239 and 240 as shown in FIGS. 28 to 2C, p-type conductivity is secured by setting the boron (B) concentration added in this process at 1.5 to 3 times as much as that of phosphorus, so that TFT characteristics is not affected.

(processes for formation of first interlayer insulating film, thermal activation, and hydrogenation: FIG. 3C)

Next, crystalline silicon film selectively doped with the said impurity elements is divided into islands by etching, and a protection insulating film 241 that will later become a part of the first interlayer insulating film is formed. The protection insulating film 241 may be formed from a silicon nitride film, a silicon oxide film, silicon nitride oxide film or a laminate film combining these. Further, the film thickness may be set at 100 to 400 nm.

A thermal treatment process for activating impurity elements imparting n-type or p-type doped into respective concentration is then performed. This process may be performed by methods such as furnace annealing, laser annealing, or rapid thermal annealing (RTA), etc. In a laser annealing, for example, a laser light formed into a linear shape by an optical system is irradiated at oscillation frequency 50 Hz and energy density of 100 to 250 mJ/cm$^2$ by using excimer laser apparatus for the light source. In this embodiment the activation process is performed by furnace annealing. The heating process is performed in a nitrogen atmosphere between temperature of 300 to 650° C., preferably 500 to 550° C., here at 525° C. for 4 hours. Further a process for hydrogenating the active layers was performed by conducting heat treatment at 300 to 450° C. for 1 to 12 hours in an atmosphere containing hydrogen at 3 to 100%. This process is a process for terminating the dangling bonds in the active layers by thermally excited hydrogen. As another means for hydrogenation, plasma hydrogenation (hydrogen excited by plasma is used) may also be used.

In case that the crystalline film 209 that will form active layers is manufactured by crystallization method using catalyst element from an amorphous silicon film, a trace amount of catalyst element remained in the crystalline silicon film 209. Though it is possible to complete TFTs under such conditions, it was preferable as a matter of course to remove the remained catalyst element at least from the channel forming regions. There is a means for removing the catalyst element that uses gettering effect by phosphorus (P). Phosphorus (P) concentration required for gettering is almost the same level as that of impurity region (n$^+$) formed in FIG. 28, and the catalyst element can be gettered from the channel forming regions of the n-channel TFTs and the p-channel TFTs by the heat treatment for activation process performed here.

Figure 4:
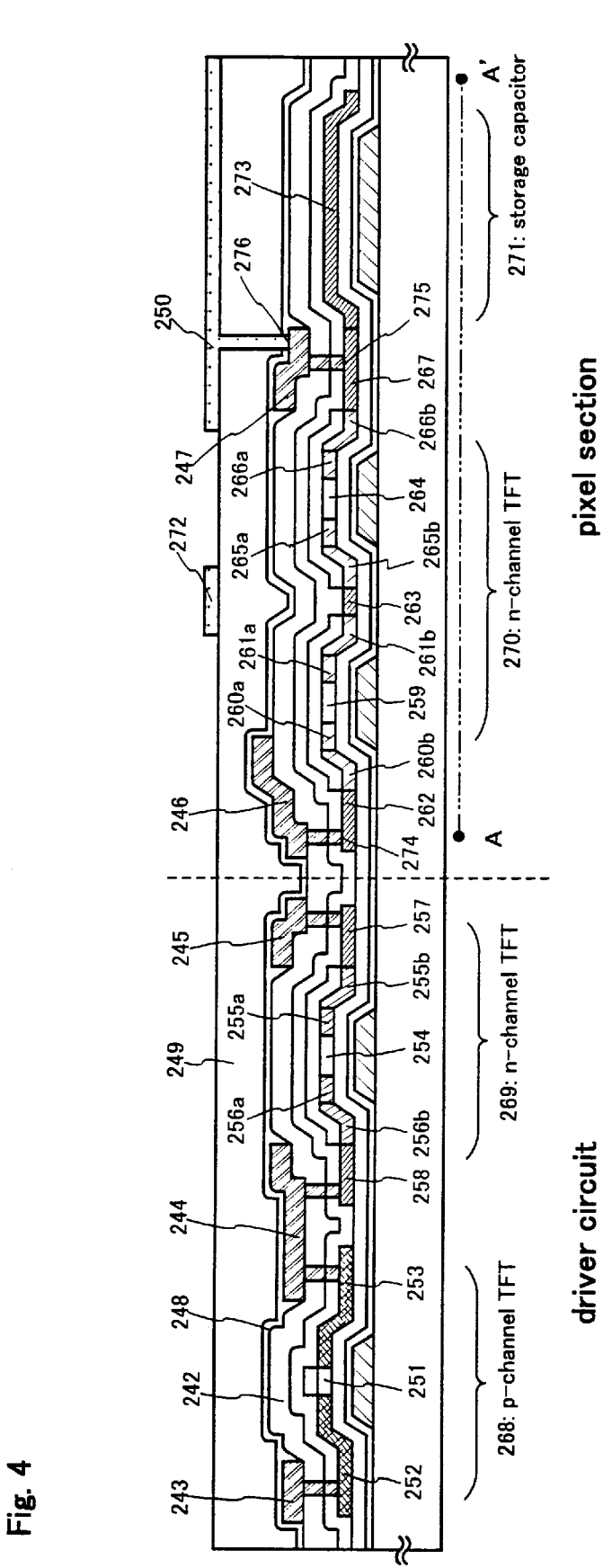
FIG. 4 is a diagram showing cross sectional view of a pixel section and a driver circuit in the manufacturing processes.

(formation of interlayer insulating film, formation of source and drain wirings, formation of passivation film and formation of pixel electrodes: FIG. 4)

After finishing activation process, an interlayer insulating film 242 having 500 to 1500 nm thickness is formed on the protection insulating film 241. A lamination film comprising the said protection insulating film 241 and the interlayer insulating film 242 is used as the first interlayer insulating film. Thereafter contact holes reaching source region or drain region of respective TFTs are formed, and source wirings 243, 245 and 246 and drain wirings 244 and 247 are formed. Though not shown in the Figure, this wiring is a lamination having triple layered structure in which a Ti film of 100 nm, an aluminum film containing Ti of 300 nm and a Ti film of 150 nm are formed successively by sputtering.

Next a passivation film 248 is formed by silicon nitride film, silicon oxide film or silicon nitride oxide film into a thickness of 50 to 500 nm (typically 100 to 300 nm). A preferable result was obtained for improving TFT characteristics when a hydrogenation treatment is performed in this state. For instance, heat treatment of 300 to 450° C. may be performed for 1 to 12 hours in an atmosphere containing 3 to 100% hydrogen or a similar result can be obtained when plasma hydrogenation is used. An opening section may be formed here at a position where contact hole is later formed for connecting pixel electrode and the drain wiring.

Thereafter the second interlayer insulating film 249 comprising organic resin is formed into a thickness of 1.0 to 1.5 μm. As the organic resin, polyimide, acrylic, polyamide, polyimide amide, BCB (benzocyclo butene) etc. may be used. A polyimide which polymerizes by heat after applying over the substrate is used here, and formed by firing at 300° C. Contact holes reaching drain wiring 247 are formed in the second interlayer insulating film 249 and pixel electrode 250 is formed. Note that the pixel electrode 272 is a separate pixel electrode adjoining each other. Pixel electrode 250 may use a transparent conductive film in case of forming a transmission type liquid crystal display device, and may use a metallic film in case of forming a reflection type liquid crystal display device. In this embodiment an indium tin oxide (ITO) film is formed into 100 nm thickness by sputtering in order to form a transmission type liquid crystal display device.

Thus an active matrix substrate comprising a driver circuit and a pixel section over a same substrate is completed. N-channel TFT 269 and p-channel TFT 268 are formed for the driver circuit which enabled formation of OMOS circuit. A pixel TFT 270 comprising an n-channel TFT is formed in the pixel section.

An active layer of p-channel TFT in the driver circuit comprises a channel forming region 251, a source region 252 and a drain region 253. An n-channel TFT 269 comprises a channel forming region 254, Lov region 255a and 256a, Loff region 255b and 256b, source region 257 and drain region 258. The length of this Loff region in the direction of channel is 0.5 to 3.0 μm, preferably 1.0 to 2.0 μm. A pixel section n-channel TFT 270 comprises channel forming regions 259 and 264, Lov regions 260a, 261a, 265a and 266a, and Loff regions 260b, 261b, 265b and 266b. The length of this Lov region in the direction of channel is 0.5 to 3.0 μm, preferably 1.0 to 2.0 m. The length of the Loff region in the direction of channel is 0.5 to 3.0 μm, preferably 1.5 to 2.5 μm. Further, a storage capacitor 271 is formed by: a capacitance wiring 206 formed at the same time as the gate electrode; an insulating film comprising the same material as the gate insulating film; and semiconductor layer 273 added with an impurity element imparting n-type and connected to a source or drain region 267 of n-channel TFT 270. Though the n-channel TFT 270 of the pixel section is a double gate structure in FIG. 4, it may be a single gate structure, and it is acceptable to form a multi-gate structure providing a plurality of gate electrodes.

Embodiment 2

A case of simultaneously manufacturing TFTs of a pixel section and a driver circuit disposed in its peripheral by a different method from embodiment 1 is described in Embodiment 2 by using FIGS. 5A to 7B.

First in the similar way to Embodiment 1, gate electrodes 302 to 304, gate wiring (not shown), capacitance wiring 306, gate insulating film formed by double layered structure 307 and 308, and crystalline silicon film 309 are formed over a substrate 301.

A first spacer film comprising a silicon oxide film or a silicon nitride film is formed on the crystalline silicon film 309. Further, a second spacer film is laminated thereon. This film comprises an Al film in order that a selective patterning with the spacer film and the crystalline silicon film is easily performed in the later step, and the thickness is set at 150 nm. Resist masks 310 to 313 are then formed by a publicly known patterning technique, and first spacers 314, 316, 318 and 320, and second spacers 315, 317, 319 and 321 are formed in the region where active layers of TFTs are formed by etching the second spacer film by phosphoric acid solution and the first spacer film by diluted hydrofluoric acid. Impurity regions ($n^+$) 322 to 326 doped with phosphorus (P) are then formed by ion doping as shown in FIG. 5B. Here the concentration of the impurity regions are set at $5 \times 10^2 cm^{-3}$.

The second spacers are etched from the edge surface by using phosphoric acid solution applied onto the substrate of the condition of FIG. 5B, and second spacers 327 to 330 are formed into the shape shown in FIG. 5C.

Resist masks 310 to 313 are removed thereafter and impurity regions ($n^-$) 331 to 338 are formed by adding phosphorus (P) by ion doping. Here the second spacers 327 to 330 functioned as masks, and the concentration of impurity element in this region is set for example at $2 \times 10^{17} cm^{-3}$.

Resist masks 339 and 340 are then formed in order to form LDD regions of driver circuit n-channel TFTs, and impurity regions ($^-$) 341 and 342 are formed by adding phosphorus (P) by ion doping. The concentration of impurity element in this region is set for example at $8 \times 10^{17} cm^{-3}$. (FIG. 6B)

A process for adding impurity element imparting p-type in the source region and the drain region of p-channel TFTs in the driver circuit is performed in the similar way as FIG. 3B. First, a new resist mask 343 is formed on the second spacer film 327, and new first spacer film 347 and second spacer film 346 are formed by performing etching treatment onto the first and second spacer films. Regions where n-channel TFTs are formed are protected by covering with resist masks 344 and 345. Impurity regions ($p^+$) 348 and 349 are then formed by ion doping using diborane ($B_2H_6$). The boron (B) concentration in these regions are set at $1 \times 10^{21} cm^{-3}$. Though regions where phosphorus (P) is mixed at a concentration of $5 \times 10^2 cm^{-3}$ are formed in a part of impurity regions ($p^+$) 348 and 349, p-type conductivity is secured by setting the boron (B) concentration added in this process at 2 times as much as the phosphorus, so that the TFT characteristics are not affected. (FIG. 6C)

Processes thereafter are performed similarly as Embodiment 1, protection insulating film 350 is formed as shown by FIG. 7A, and activation process is performed by furnace annealing. After performing hydrogenation process, interlayer insulating film 351 is formed, thereby forming a first interlayer insulating film by double layered structure with the protection insulating film 350. Source wirings 352, 354 and 355 and drain wirings 353 and 356 are then formed, passivation film 357 and the second interlayer insulating film 358 are formed by lamination, and pixel electrodes 359 and 381 are provided.

An active layer of the p-channel TFT 377 in driver circuit comprises a channel forming region 360, a source region 361 and a drain region 362. N-channel TFT 378 comprises a channel forming region 363, Lov regions 364a and 365a, Loff regions 364b and 364b, source region 366 and drain region 367. A pixel section n-channel TFT 379 comprises a channel forming regions 368 and 373, Lov regions 369a, 370a, 374a and 375a and Loff regions 369b, 370b, 374b and 375b. A storage capacitor 380 is formed by: a capacitance wiring 306 formed at the same time as the gate electrode; an insulating film comprising the same material as the gate insulating film; and semiconductor layer 382 added with an impurity element imparting n-type and connected to a source or drain region 376 of n-channel TFT 379.

Embodiment 3

Figure 9:
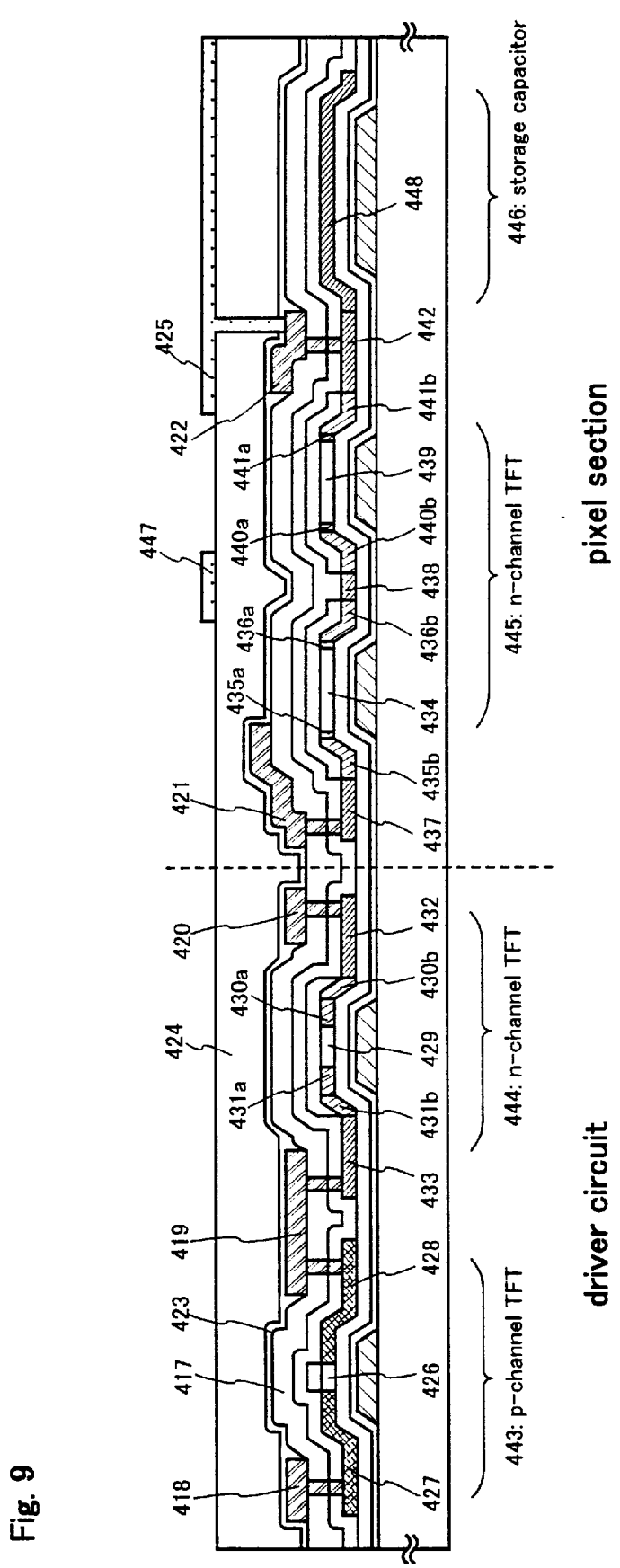
FIG. 9 is a diagram showing cross sectional view of a pixel section and a driver circuit in the manufacturing processes.

An example of other structure of TFTs of pixel section and the driver circuit is described in the present embodiment by using FIGS. 8A to 9. A substrate of the condition of FIG. 5C is formed according to Embodiment 2.

Impurity regions ($n^-$) 401 to 408 are formed by adding phosphorus (P) into the crystalline silicon film underneath by ion doping interposing the first spacer film. The phosphorus (P) concentration for these regions are set to be $6 \times 10^{21} cm^{-3}$. A second spacer film functioned here as a mask, and phosphorus (P) is not added to the region where it overlapped with a first spacer film. When ion doping is used, such impurity element doping can be easily performed by properly setting the acceleration voltage. (FIG. 8A)

A process for adding impurity element imparting p-type is then performed into the source region and the drain region of the p-channel TFT of the driver circuit. A new resist mask 409 is formed on the second spacer film 327, and first spacer film 413 and second spacer film 412 are newly formed by performing etching treatment onto the first and second spacer films. The region where n-channel TFTs are formed are covered by resist masks 410 and 411. Impurity regions ($p^+$) 414 and 415 are then formed by ion doping using dborane ($B_2H_6$). The boron (B) concentration in these regions are set at $2.5 \times 10^{21} cm^{-3}$. (FIG. 8B)

Processes thereafter are performed similarly to the Embodiment 2, protection insulating film 416 is formed as shown in FIG. 8C and activation process is performed by furnace annealing. Further after performing hydrogenation process, interlayer insulating film 417 is formed as shown in FIG. 9, which comprises a first interlayer insulating film by double layered structure with the protection film 416. Then source wirings 418, 420 and 421 and drain wirings 419 and 422 are formed, passivation film 423 and the second interlayer insulating film 424 are formed by lamination, and pixel electrodes 425 and 447 are disposed.

Thus the p-channel TFT 443 of the driver circuit comprises a channel forming region 426, a source region 427 and a drain region 428. The n-channel TFT 444 comprises a channel forming region 429, Lov regions 430a and 431a, Loff regions 430b and 431b, a source region 432 and a drain region 433. The pixel section n-channel TFT 445 comprises a channel forming regions 434 and 439, Lov regions 435a, 436a, 440a and 441a and Loff regions 435b, 436b, 440b and 441b. A storage capacitor 446 is formed by: a capacitance wiring 446 formed at the same time as the gate electrode; an insulating film comprising the same material as the gate insulating film; and semiconductor layer 448 added with an impurity element imparting n-type and connected to a source or drain region 442 of n-channel TFT 445.

Embodiment 4

An example of other structure of TFTs of pixel section and the driver circuit is described in the present embodiment by using FIGS. 10A to 11. A substrate of the condition of FIG. 5C is formed in accordance with Embodiment 2. Impurity regions (n⁻) 501 to 508 are formed by adding phosphorus (P) into the crystalline silicon film underneath by ion doping interposing the first spacer film. The phosphorus (P) concentration for these regions are set to be $1 \times 10^{18}$ cm⁻³. (FIG. 10A)

LDD regions of the pixel section n-channel TFT are formed next. A mask for protecting channel is formed by a resist film for that purpose. This mask is formed by forming a photo resist film over the entire surface and by patterning by exposure of light from the back side. Here gate electrodes 202 to 204 functioned as photo masks, and channel protecting masks 509 to 512 are formed on the region inside the gate electrode and over the first spacer film. Impurity element imparting n-type is then added by ion doping into the crystalline silicon film under the spacer film by interposing the spacer film. The phosphorus (P) concentration of thus formed impurity regions (n⁻) 513 to 516 is set at $5 \times^{17}$ cm⁻³. (FIG. 10B)

A process for forming a source region and a drain region of the driver circuit p-channel TFT is performed after removing masks for channel protection. A new resist mask 517 is formed first on the first spacer film 314, and a new first spacer film 520 is formed by performing etching treatment onto the first spacer film. The region where n-channel TFTs are formed is covered by resist masks 518 and 519. Impurity regions (p⁺) 521 and 522 are then formed by ion doping using diborane (B₂H₆). The boron (B) concentration in this region is set at $3 \times 10^{21}$ cm⁻³. (FIG. 10C)

Figure 11A:
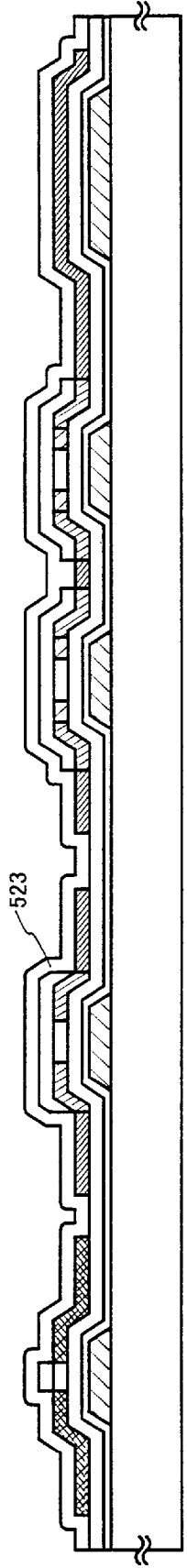
FIGS. 11A and 11B are diagrams showing cross sectional views of a pixel section and a driver circuit in the manufacturing processes.
Figure 11B:
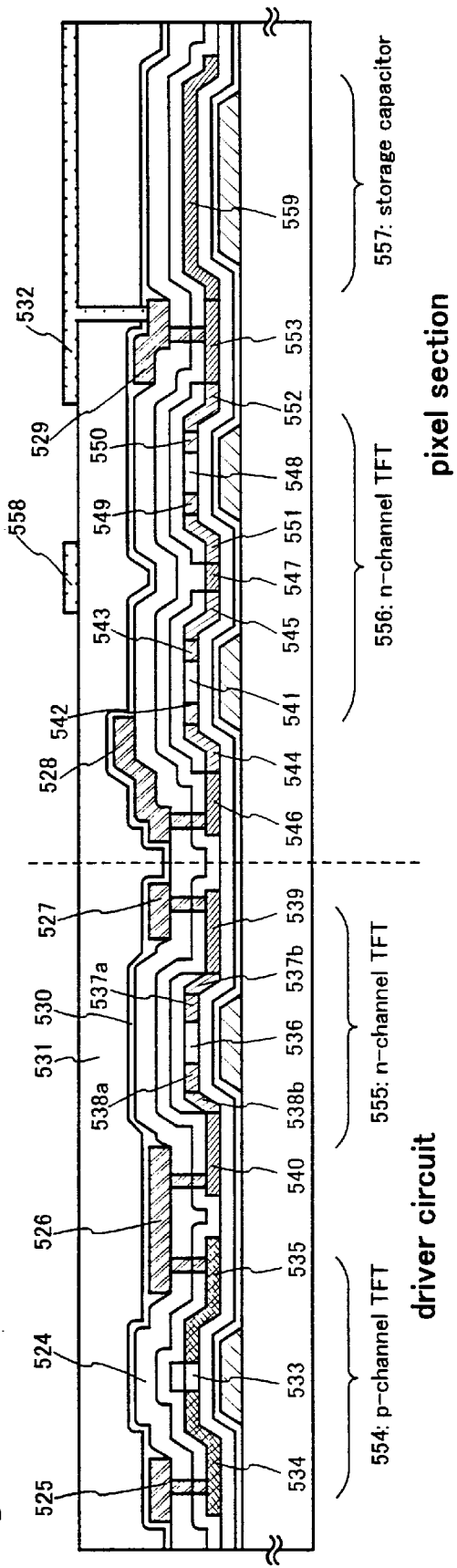

Processes thereafter are performed similarly to those of Embodiment 2, protection insulating film 523 is formed as shown in FIG. 11A, and activation process is performed by furnace annealing. Further after performing hydrogenation process, interlayer insulating film 531 is formed as shown in FIG. 11B, which comprises the first interlayer insulating film by double layered structure with the protection film 416. Then source wirings 525, 527 and 528 and drain wirings 526 and 529 are formed, passivation film 530 and the second interlayer insulating film 531 are formed into lamination, and pixel electrodes 532 and 538 are disposed.

Thus the p-channel TFT 554 of the driver circuit comprises a channel forming region 533, a source region 534 and a drain region 535. The n-channel TFT 555 comprises a channel forming region 536, Lov regions 537a and 538a, Loff regions 537b and 538b, a source region 539 and a drain region 540. The pixel section n-channel TFT 556 comprises a channel forming regions 541 and 548, Lov regions 542, 543, 549 and 550 and Loff regions 544, 545, 551 and 552. Here Lov region is formed into an impurity concentration of n⁻, and Loff is formed into an impurity concentration of n⁻. A storage capacitor 557 is formed by: a capacitance wiring 306 formed at the same time as the gate electrode; an insulating film comprising the same material as the gate insulating film; and semiconductor layer 559 added with an impurity element imparting n-type and connected to a source or drain region 553 of n-channel TFT 559.

Embodiment 5

Figure 12:
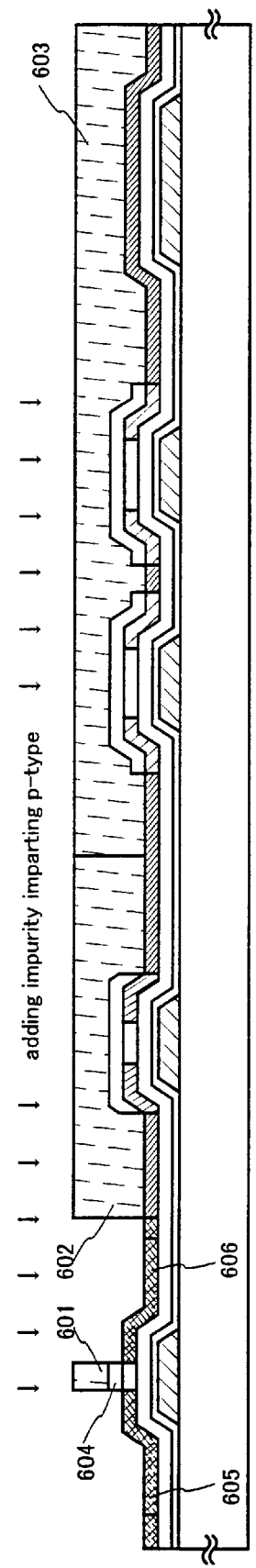
FIG. 12 is a diagram showing cross sectional view of a pixel section and a driver circuit in the manufacturing processes.

An example of other structure of TFTs of pixel section and the driver circuit is described in the present embodiment by using FIG. 12. Processes up to the state of FIG. 6B is performed similarly. Then the second spacer films 327 to 330 are removed and a resist mask 601 is formed on the first spacer 314. The region where n-channel TFTs are formed is protected by covering with resist masks 602 and 603. A new spacer 604 is formed by performing etching treatment onto the first spacer film 314. Impurity regions (p⁺) 605 and 606 are then formed by ion doping using diborane (B₂H₆).

When the subsequent processes from FIG. 7B are performed according to those of Embodiment 2, an active matrix substrate of the structure described in FIG. 7B can be formed.

Embodiment 6

An example of other structure of TFTs of pixel section and the driver circuit is described in the present embodiment by using FIGS. 13A to 15. Firstly according to Embodiment 1 gate electrodes 702 to 704, gate wiring (not shown), gate insulating films 706 and 707 formed from a double layered structure, and crystalline silicon film 708 are formed as shown in FIG. 13A.

Spacer film 705 is then formed on the crystalline silicon film 708 as shown in FIG. 13B, and masks for channel protection 709 to 712 are formed with resist by back exposure of light similarly to that performed in the Embodiment 2. Impurity regions (n⁻) 713 to 717 are formed by adding phosphorus (P) into the crystalline silicon except for the channel forming regions of TFTs by ion doping using the masks for channel protection. The concentration of impurity element in this region may be for example $1 \times 10^{7}$ cm⁻³.

Next resist masks 718 and 719 are formed with masks for channel protection remained as shown in FIG. 13C, and impurity regions (⁻) 720 and 721 for LDD regions of driver circuit n-channel TFT are formed. It is preferable to set the concentration of impurity element in this region 2 to 10 times as much as that of impurity regions (n⁻), for example it can be $3 \times 10^{17}$ cm⁻³.

New spacer films 726 to 729 are formed by performing etching treatment onto the spacer film, by using resist masks 722 to 725 formed by light exposure from back side. Phosphorus (P) is added in this state and impurity regions (n⁻) 730 to 734 are formed. The concentration of impurity element in this region may be for example $1 \times 10^{20}$ cm⁻³.

After removing resist masks 722 to 725, new resist mask 735 is formed on the inside of the spacer film 726 over the spacer film and a spacer film 738 with new shape is formed by performing etching treatment by using the new resist mask. The region where n-channel TFTs are formed is covered by resist masks 736 and 737. Impurity regions (p⁺) 739 and 740 are formed by ion doping using diborane (B₂H₆). The boron (B) concentration in this region is set at $4 \times 10^{20}$ cm⁻³. (FIG. 14B)

Figure 15:
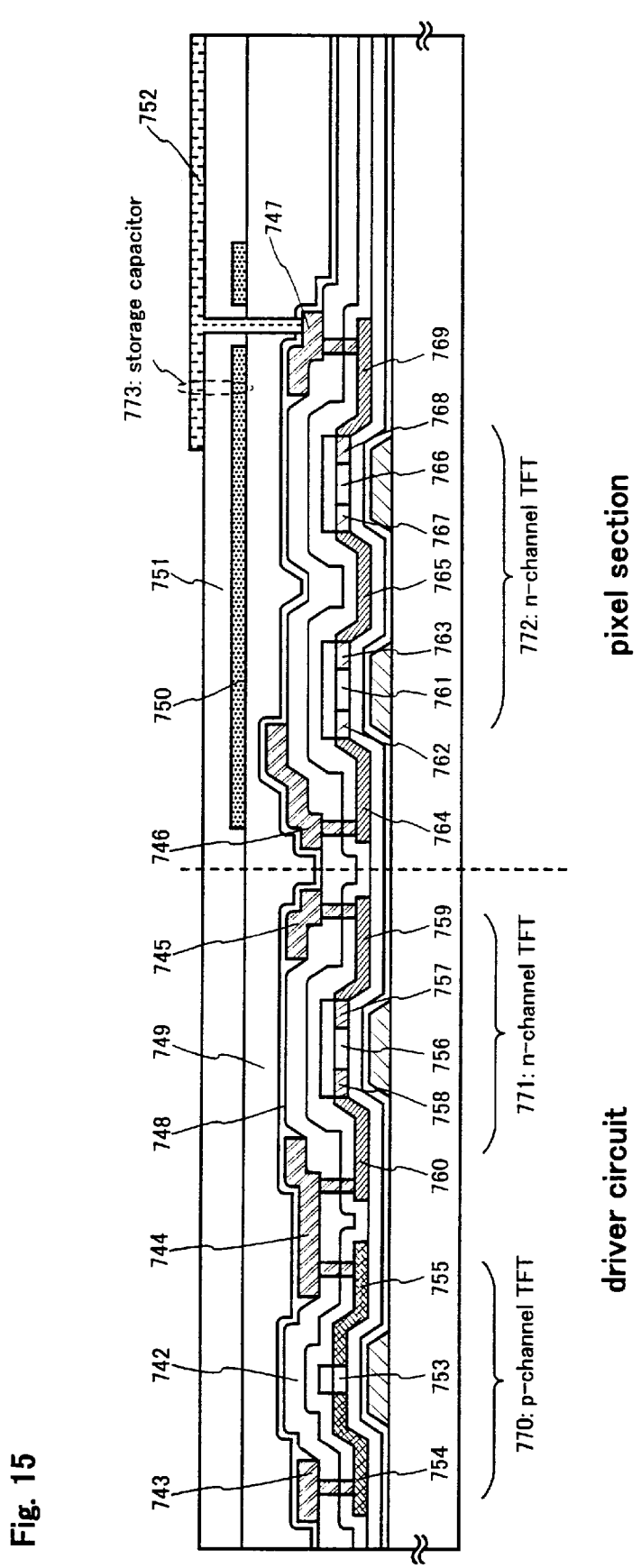
FIG. 15 is a diagram showing cross sectional view of a pixel section and a driver circuit in the manufacturing processes.

Protection insulating film 741 is then formed as shown in FIG. 14C in the similar way as Embodiment 1, and activation process by furnace annealing is performed. Further after performing hydrogenation process interlayer insulating film 742 is formed as shown in FIG. 15 thereby forming the first interlayer insulating film formed by a double layered structure with the protection insulating film 741. Source wirings 743, 745 and 746 and drain wirings 744 and 747 are formed next and a passivation film 748 is formed. Hydrogenation treatment is performed in this state in an atmosphere containing 3 to 100% hydrogen at 300 to 450° C. for 1 hour. The second interlayer insulating film 749 comprising organic resin is then formed into approximately 1 μm thick.

A black matrix film 750 is then formed over the second interlayer insulating film 749 in the region that becomes a pixel section. The black matrix film 750 is a film whose main component is an element or a plurality of elements selected from Al, Ti and Ta, formed into 100 to 300 nm thick and formed into desired pattern. The third interlayer insulating film is formed similarly to the second interlayer insulating film by using organic resin. The thickness of the third interlayer insulating film is set 0.5 to 1 μm. Contact hole reaching the source wiring 747 is formed through the third interlayer insulating film 751, the second interlayer insulating film 749 and the passivation film 748, and a pixel electrode 752 is disposed. In order to fabricate a transmission type liquid crystal display device here, an indium tin oxide (ITO) film is formed into 100 nm thick by sputtering.

Thus the p-channel TFT 770 of the driver circuit comprises a channel forming region 753, a source region 754 and a drain region 755. The n-channel TFT 771 comprises a channel forming region 756, Lov regions 757 and 758, a source region 759 and a drain region 760. The pixel section n-channel TFT 772 comprises a channel forming regions 761 and 766, Lov regions 762, 763, 767 and 768, a source region 764 and a drain region 769. A storage capacitor 773 is formed in a region where the pixel electrode 752 and the black matrix film 751 overlaps by interposing the third interlayer insulating film.

Embodiment 7

An example of fabricating the crystalline semiconductor film that forms active layer of TFTs shown in Embodiments 1 to 6 are described in Embodiment 7. There is no specific limitation to the fabrication method for the crystalline semiconductor film in the present invention, and a laser crystallization technique (or laser annealing), or a thermal crystallization technique (or solid phase growth method) using furnace annealing or rapid thermal annealing (RTA) etc can be used.

In case of using a laser crystallization, laser annealing process may be performed after forming amorphous semiconductor film. Hydrogen content may be preferably reduced to below 5 atom % by releasing hydrogen in the film by heating at 400 to 550° C. for several hours preceding the crystallization when the amorphous semiconductor film includes hydrogen like as in the case of amorphous silicon film. Thereafter a radiation emitted from the laser source (laser light) is irradiated onto the amorphous semiconductor film. Excimer laser light of pulse oscillation type or continuous light emitting type is preferable but it is acceptable to use argon laser. Further, a light emitted from a lamp may be irradiated in place of laser light (lamp annealing). A halogen lamp, a xenon lamp, a metal halide lamp etc can be used for the lamp radiation.

In case of using a pulse oscillation type excimer laser, laser annealing is performed forming the laser light into linear shape. The laser annealing conditions are: pulse oscillation frequency at 30 Hz: and laser energy density at 100 to 500 mJ/cm$^2$ (preferably 350 to 400 mJ/cm$^2$). The linear beam is irradiated all through the surface of the substrate, and the overlap ratio of the linear beam here is set at 80 to 98%. The crystalline semiconductor film can be fabricated in this way.

Other method for fabricating the crystalline semiconductor film is, for example, applying a technique disclosed in the Japanese Patent Application Laid-Open No. Hei 7-130652. The application of the technology disclosed in the patent application to the present invention is shown below. Firstly gate electrodes 1602 and 1603 are formed into 100 to 400 nm thickness over a substrate 1601 (glass substrate in Embodiment 7). The gate electrodes comprise a material including one or plural of elements selected from a group consisting of Al, Ti, Ta, Mo, W, Ni and Cu, and formed into a pattern to have a tapered shape at the edge. Further though not shown in the Figure, it may apply a laminate structure of the said material. For example a double layered structure of tantalum nitride (TaN) and Ta from the substrate may be formed. Moreover, an oxide film may be formed on the surface of the gate electrodes by anodic oxidation etc. A gate insulating film 1604 is formed into 20 to 200 nm thickness, preferably 150 to 200 nm, and comprises a silicon nitride film a silicon oxide film or a silicon nitride oxide film. The structure laminating a plurality of these films may be used too. An amorphous semiconductor film (amorphous silicon film in the present embodiment) 1606 is formed into 50 nm thickness over the gate insulating film 1604 successively without exposing to the air.

An aqueous including 10 ppm by weight of catalytic element (nickel in the present embodiment) (a nickel acetate aqueous) is next applied by spin coating and a catalytic element including layer 1607 is formed on the entire surface of the amorphous semiconductor film 1606. A usable catalytic element here other then nickel (Ni) is germanium (Ge), iron (Fe), palladium (Pd), tin (Sn), lead (Pb), cobalt (Co), platinum (Pt), copper (Cu) and gold (Au).

Though the present embodiment used a method of adding nickel by spin coating, a method in which a thin film comprising catalytic element (nickel film in the present embodiment) is formed on the amorphous semiconductor film by evaporation or sputtering may be taken too.

Next after heat treatment process is performed at 400 to 500° C. for approximately 1 hour and hydrogen is removed from the film preceding the crystallization process, heat treatment of 500 to 650° C. (preferably 550 to 570° C.) is performed for 4 to 12 hours (preferably 4 to 6 hours). In the present embodiment heat treatment is performed at 550° C. for 4 hours and crystalline semiconductor film (crystalline silicon film in the present embodiment) 1608 is formed. (FIG. 16B)

Thus formed crystalline semiconductor film 1608 can be formed by using catalytic element which promotes crystallization (nickel here) and is a crystalline semiconductor film superior in crystallinity. Laser crystallization may be combined thereafter in order to enhance the crystalline proportion. For example a linear beam is formed from XeCl excimer laser light (wavelength 308 nm) and irradiated onto the crystalline semiconductor film 1608 fabricated in FIG. 16B at oscillation frequency 5 to 50 Hz, energy density at 100 to 500 mJ/cm$^2$, and overlap ratio of the linear beam at 80 to 98%. As a result, a crystalline semiconductor film 1609 having further superior crystallinity can be obtained.

An excellent performance can be obtained when TFTs are fabricated in the steps shown in Embodiments 1 to 6 by using a crystalline semiconductor film fabricated over a substrate 1601. The characteristics of TFTs can be represented typically by electric field effect mobility, and TFT characteristics obtained by the present invention is 150 to 220 cm$^2$/V·sec for n-channel TFT, and 90 to 120 cm$^2$/V·sec for p-channel TFT, and further, characteristic degradation from the initial value is scarcely observed though continuously operated.

Embodiment 8

Other manufacturing method for the TFTs of pixel section and the driver circuit is described by using FIGS. 17A to 19. Firstly as similar to Embodiment 1 gate electrodes 802 to 804, gate wiring (not shown), capacitance wiring 806, and gate insulating films 807 and 808 comprising a double layered structure are formed over the substrate 801 as shown by FIG. 18A. The crystalline semiconductor film 809 (crystalline silicon film here) is formed in the present embodiment by using a publicly known laser crystallization.

A spacer film comprising a silicon oxide or a silicon nitride is formed into 120 nm thick on the crystalline semiconductor film 809 and patterns are formed by using light exposure from the back side. Resist masks 814 to 817 are formed on thus formed spacer films 810 to 813. Spacer films 810 to 813 are formed on the channel forming regions in effect, and has an effect for preventing contamination from the resist in relation to the later process. Impurity regions (n+) 818 to 821 are formed in the crystalline semiconductor film by adding impurity element imparting n-type. This is performed by ion doping (ion implantation may also be used) using phosphine ($PH_3$) and the phosphorus (P) concentration is set between $1 \times 10^{20}$ to $1 \times 10^{21}$ $cm^{-3}$, here at $1 \times 10^{21}$. (FIG. 1

In order to form LDD regions of pixel section n-channel TFT a process for adding impurity imparting n-type is performed next. Here a silicon oxide film 822 is formed into 100 nm thickness on the crystalline semiconductor film 809 in order to control phosphorus (P) concentration added. Impurity element imparting n-type is added into the crystalline semiconductor film under the silicon oxide film 822 by interposing the silicon oxide film by ion doping. The phosphorus (P) concentration of thus formed impurity regions (n−) 823 to 830 is set at between $1.7 \times 10^{17}$ and $2.5 \times 10$ $cm^{-3}$, here at $1.7 \times 10^{17}$. (FIG. 17C)

LDD regions of driver circuit n-channel TFTs are similarly formed by ion doping by interposing silicon oxide film 822. In this case in order not to affect at least the impurity regions 827 to 830 of the pixel section formed in the preceding process, resist masks 831 and 832 are formed. The phosphorus (P) concentration of thus formed impurity regions (n−) 833 and 834 is set in a range between $5 \times 10^{17}$ and $5 \times 10^{18}$ $cm^{-3}$, but it is set between 2 times or more and 10 times or less than the concentration of n−, and formed into $5 \times 10^{17}$ $cm^{-3}$. (FIG. 18A)

A process for adding impurity element imparting p-type is performed in order to form source region and drain region of driver circuit p-channel TFT. New resist masks 836 and 837 are formed here in order to decide the channel forming region of p-channel TFT, and the surface of the crystalline semiconductor film is exposed by removing by etching the silicon oxide film at the region where p-channel TFTs are formed. By doing so, doping of the impurity elements by doping can be made easier. Impurity regions 839 and 840 are formed by ion doping using diborane ($B_2H_6$). The boron (B) concentration in this region is set at $1.5'10^{20}$ to $3 \times 10^{21}$ $cm^{-3}$.

Subsequent processes are performed in similar to Embodiment 1, and a protection insulating film 841 is formed as shown in FIG. 18C and activation process is performed by furnace annealing. After performing hydrogenation process interlayer insulating film 842 is formed thereby forming a first interlayer insulating film is formed which comprises a double layered structure with the protection insulating film 841. Then source wirings 843, 845 and 846, drain wirings 844 and 847, passivation film 848, and the second interlayer insulating film 849 are formed, and pixel electrodes 850 and 872 are disposed.

An active layer of the p-channel TFT 858 in driver circuit comprises a channel forming region 851, a source region 852 and a drain region 853. N-channel TFT 869 comprises a channel forming region 854, Lov regions 855a and 856a, Loff regions 855 and 856b, source region 858 and drain region 857. A pixel section n-channel TFT 870 comprises a channel forming regions 859 and 864, Lov regions 860a, 861a, 865a and 866a and Loff regions 860b, 861b, 865b and 866b. A storage capacitor 871 is formed by: a capacitance wiring 806 formed at the same time as the gate electrode; an insulating film comprising the same material as the gate insulating film; and semiconductor layer 873 added with an impurity element imparting n-type and connected to a source or drain region 866 of n-channel TFT 870.

Embodiment 9

In the manufacturing method of an active matrix substrate comprising TFTs of a pixel section and a driver circuit provided in its peripheral described in Embodiments 1 to 8, any of: semiconductor film that forms active layer; insulating films such as a gate insulating film, an interlayer insulating film and a base film etc; conductive films such as a gate electrode, a source wiring, a drain wiring and a pixel electrode; can be manufactured by using sputtering. The advantageous point for using sputtering is that it is suited for forming a uniform film over a large area substrate because DC (direct current) discharge method can be applied in the deposition of conductive films etc. Further, safety of the work can be secured because silane ($SiH_4$) which requires much caution in treatment can be dispensed with, in depositing silicon materials such as amorphous silicon film, or silicon nitride film etc. These points can be made the best use of, as merits specifically in the production site. A manufacturing process using sputtering is described below in accordance with Embodiment 1.

Gate electrodes 202 to 204 and capacitance wiring 206 of FIG. 2A can be easily formed by publicly known sputtering using target materials such as Ta, Ti, W, Mo, etc. In case of making a compound materials such as W—Mo or Ta—Mo, a compound target may be similarly used. Further, in case of manufacturing TaN and WN, they can be manufactured when nitrogen ($N_2$) or ammonia ($NH_3$) is properly added to the sputtering atmosphere other than argon (Ar). Still further there are methods to control the internal stress of the deposited film by adding helium (He), krypton (Kr) or xenon (Xe) to the sputtering gas of argon (Ar).

The silicon nitride film 207 used for the gate insulating film can be formed by performing sputtering, by using a silicon (Si) target and by properly mixing Ar, $N_2$, $H_2$ and $N_2O$. Or, it can be similarly formed when a target material of silicon nitride is used. The silicon nitride oxide film 208 is manufactured by sputtering using Si target and mixing Ar, $N_2$, $H_2$ and $N_2O$.

Amorphous silicon is also manufactured similarly by using Si target and by using Ar and $H_2$ for sputtering gases. When adding a trace amount of boron (B) into the amorphous silicon film, boron (B) of several tens ppm to several thousands ppm of boron (B) may be added in the target, or diborane ($B_2H_6$) can be added in the sputtering gas.

Silicon oxide film used for the spacer films 210 to 213 can be manufactured by sputtering the silicon oxide (or quartz) target with Ar or a mixed gas of Ar and oxygen ($O_2$). A silicon nitride film, a silicon oxide film or a silicon nitride oxide film used for protection insulating film 241, interlayer insulating film 242 and passivation film 248 may be manufactured as described above.

In case of using Al for the source wiring and the drain wiring, it is effective for preventing hillocks when Ti, Si, scandium (Sc), vanadium (V), Cu etc. are included at approximately 0.01 to 5% by weight. ITO, ZnO, $SnO_2$, etc, used for the pixel electrode 250 may be deposited by publicly known sputtering method.

As described above, it is possible to deposit any of the films except for the second interlayer insulating film 249 comprising organic resin by sputtering. Note that the detailed experiment conditions may be properly determined by the operater.

Embodiment 10

Figure 19:
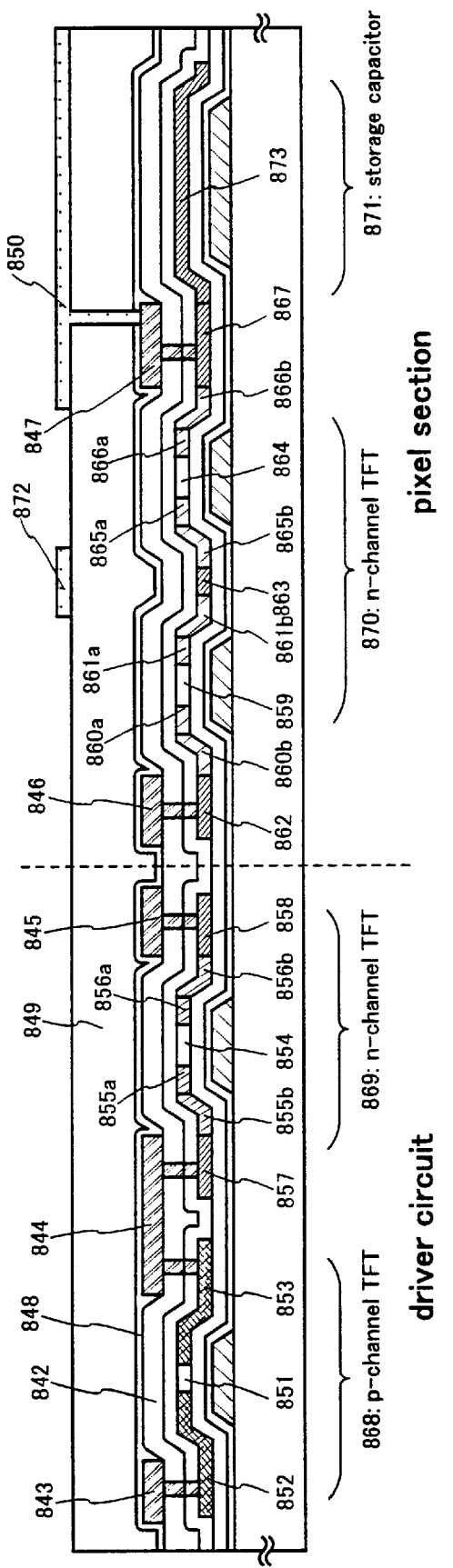
FIG. 19 is a diagram showing cross sectional view of a pixel section and a driver circuit in the manufacturing processes.
Figure 20:
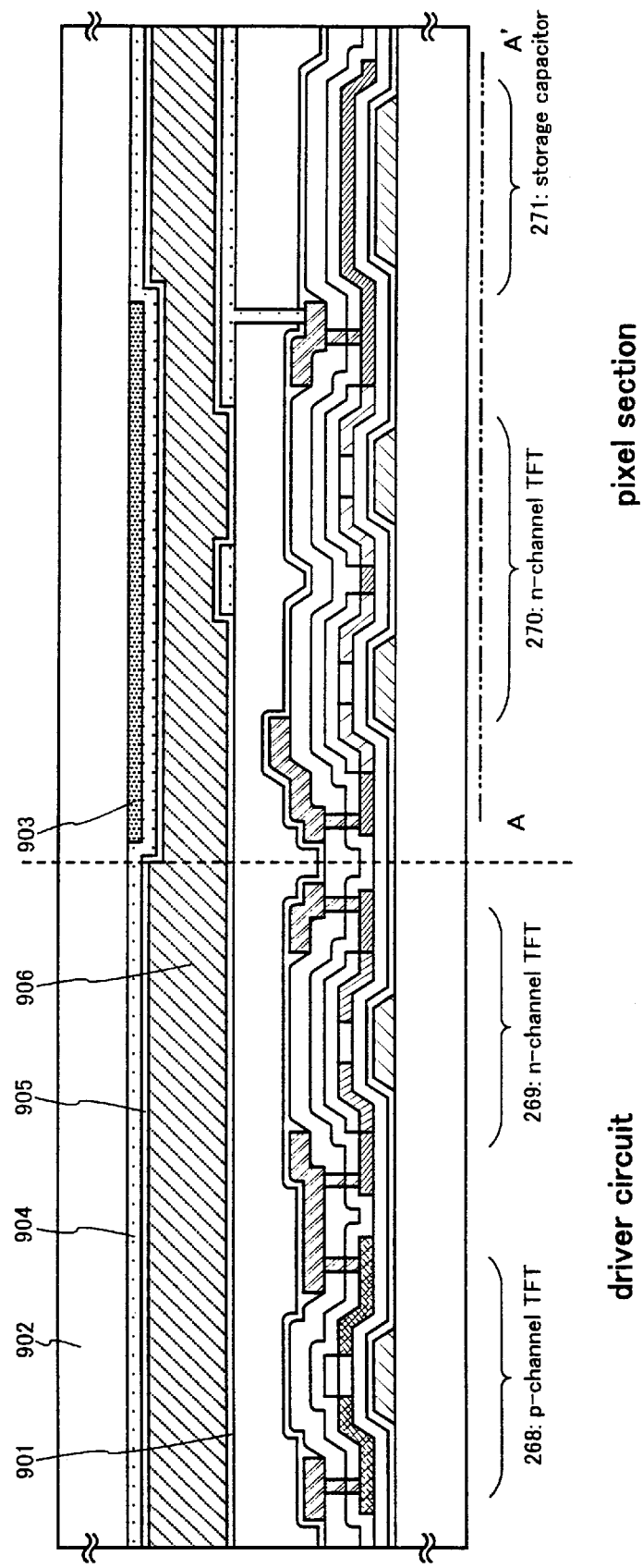
FIG. 20 is a diagram showing a cross sectional view of an active matrix liquid crystal display device.

A process for manufacturing an active matrix liquid crystal display device from an active matrix substrate is described in the present embodiment. As shown in FIG. 20, an alignment film 901 is formed onto the substrate of the state of FIG. 4 manufactured in Embodiment 1. Polyimide resin is often used in general for the alignment film of liquid crystal display element. Black matrix film 903, transparent conductive film 904 and alignment film 905 are formed on the opposing substrate 902. Rubbing treatment is performed after formation of alignment film so that liquid crystal molecules are orientated to have a certain constant pretilt angle. An active matrix substrate formed with the pixel section and the CMOS circuit, and the opposing substrate are stuck together by a known cell assembly process through sealing material or spacers etc (neither is shown). Thereafter liquid crystal material 906 is injected between the both substrates and completely sealed with a sealant (not shown). A known liquid crystal material may be used for the liquid crystal material. An active matrix liquid crystal display device is thus completed as shown in FIG. 19.

Figure 21:
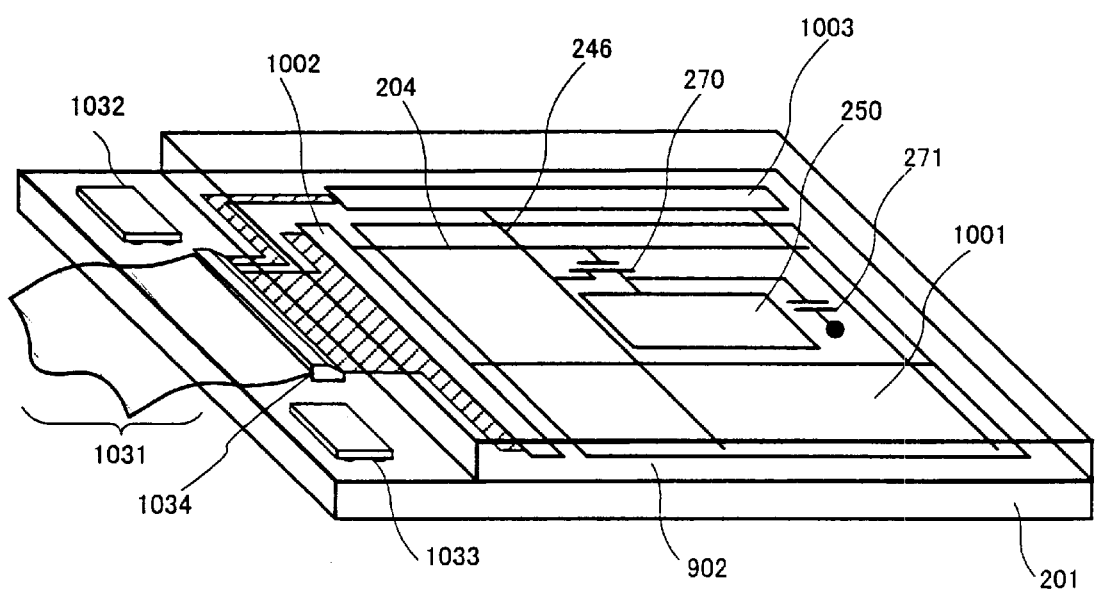
FIG. 21 shows a perspective view of an active matrix liquid crystal display device.
Figure 22:
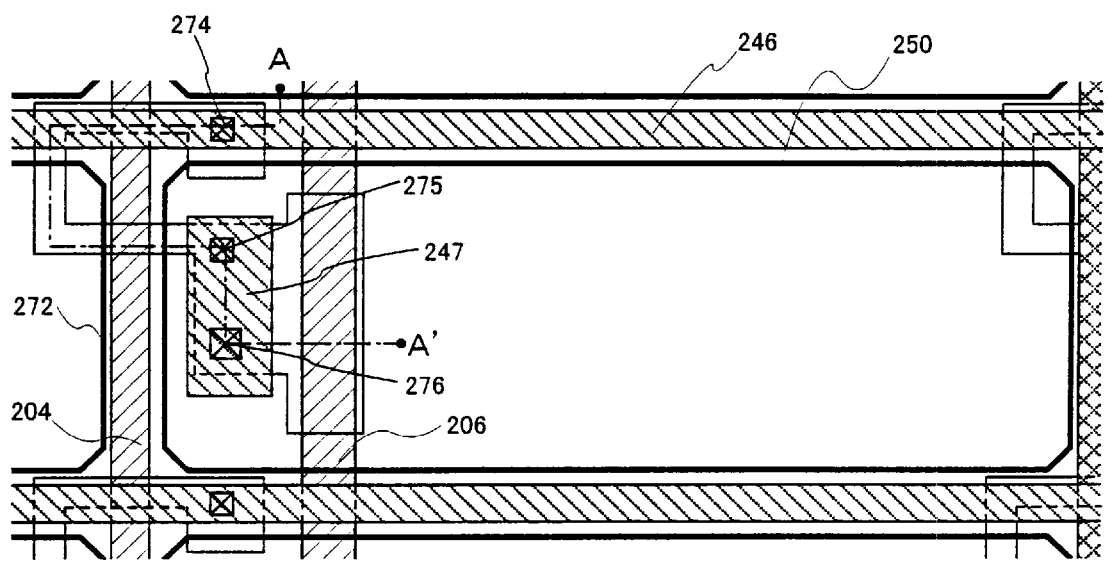
FIG. 22 is a top view at a pixel section.

The structure of this active matrix liquid crystal display device is next described by using the perspective view of FIG. 21 and the top view of FIG. 22. Note that FIGS. 21 and 22 use common reference numerals in order to correspond to the cross sectional structure of FIGS. 2A to 4. Further, the cross section at A–A' shown in FIG. 22 corresponds to the cross sectional view of the pixel section shown in FIG. 4.

The active matrix substrate comprises a pixel section 1001, a scanning (gate) line driver circuit 1002 and a signal (source) line driver circuit formed over a glass substrate 201. N-channel TFTs 270 are disposed in the pixel section and the driver circuit provided in its peripheral are structured basically from CMOS circuit. Scanning (gate) line driver circuit 1002 and signal (source) line driver circuit 1003 are respectively connected to the pixel section 1001 through gate wiring 204 (denoted by the same reference numeral to mean that it is connected to the gate electrode and formed by extending from there) and source wiring 246. Further, FPC 1031 is connected to the external input output terminal 1034.

FIG. 22 is a top view showing a part of pixel section 1001 (1 pixel). Gate wiring 204 intersects the active layer thereunder by interposing a gate insulating film now shown in the Figure. Though not shown, source region, drain region, Lov region comprising n⁻region and Loff region are formed in the active region. Further, reference numeral 274 is a contact section of the source wiring 246 and the source region 262, 275 is a contact section between drain wiring 247 and drain region 267, 276 is a contact section between drain wiring 247 and pixel electrode 250.

Though the active matrix liquid crystal display device of the present embodiment is described in reference to the structure explained in Embodiment 1, an active matrix liquid crystal display device can be fabricated by freely combining with any of the structures of Embodiments 1 to 6, 8 or 9.

Embodiment 11

An active matrix substrate and the liquid crystal display device formed in accordance with the present invention can be used in various electrooptical devices. The present invention can be applied to all of the electronic devices having these electrooptical devices as the display section. The following can be given as examples of this type of electronic devices: personal computers; digital cameras; video cameras; portable information terminals (such as mobile computers, portable telephones and electronic notebook); and car navigation systems. Some examples of these are shown in FIGS. 23A to 23F.

Figure 23A:
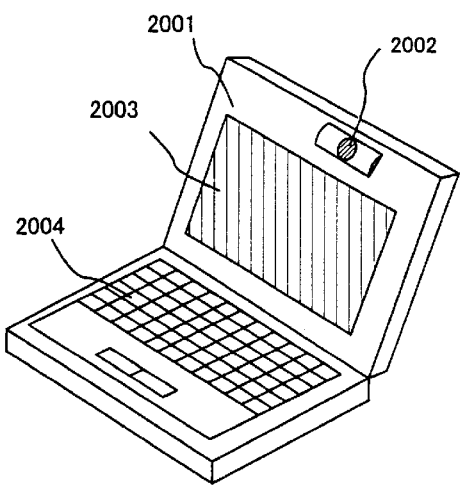
FIGS. 23A to 23F are diagrams showing an example of the semiconductor device.
Figure 23B:
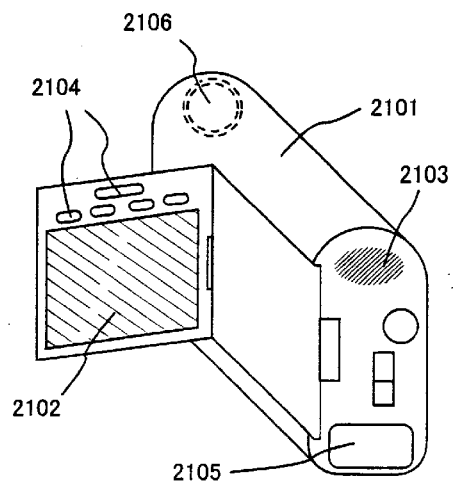

FIG. 23A is a personal computer, and comprises a main body 2001 comprising a micro-processor and memory etc, an image input section 2002, a display device 2003, and a keyboard 2004. The present invention may be applied to the display device 2003 or other signal control circuits.

FIG. 25B is a video camera, and comprises a main body 2101, a display device 2102, a voice input section 2103, operation switches 2104, a battery 2105, and an image receiving section 2106 etc. The present invention can be applied to the display device 2102 and other signal control circuits.

Figure 23C:
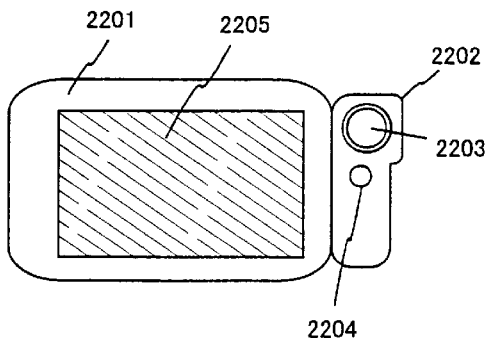

FIG. 23C is a portable information terminal, and comprises a main body 2201, an image input section 2202, image receiving section 2203, operation switches 2204 and a display device 2205. The present invention can be applied to the display device 2302 and other signal control circuits.

Figure 23D:
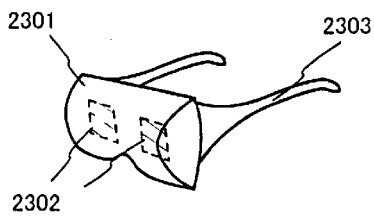

FIG. 23D is a goggle type display, and comprises a main body 2301, display device 2302, and arm section 2303 etc. The present invention can be applied to the display device 2302 and other signal control circuits.

Figure 23E:
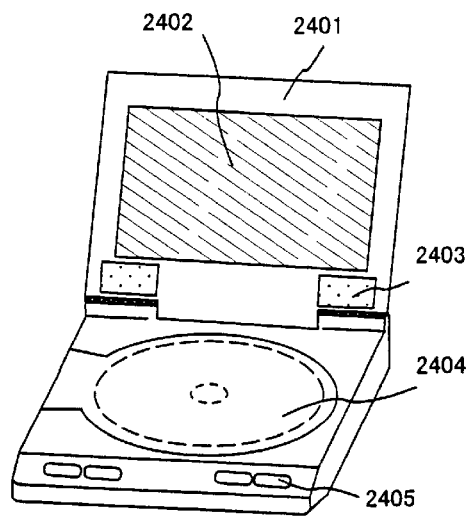
Figure 23F:
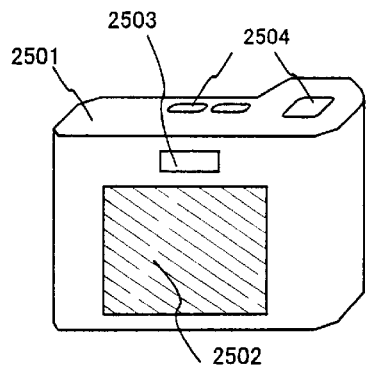

FIG. 23E is a player that uses a recording medium on which a program is recorded (hereinafter referred to as a recording medium), and comprises a main body 2401, a display device 2402, a speaker section 2403, a recording medium 2404, and operation switches 2405 etc. Note that music appreciation, film appreciation, games, and the use of the Internet can be performed with this device using a DVD (digital versatile disk), a CD, etc., as a recording medium. The present invention can be applied to the display device 2402, and to other signal control circuits FIG. 23F is a digital camera, and comprises a main body 2501, a display device 2502, a viewfinder 2503, operation switches 2504, and an image receiving section (not shown in the figure). The present invention can be applied to the display device 2502 and to other signal control circuits.

FIG. 24A is a front type projector, and comprises an optical light source system, a display device 2601 and a screen 2602. The present invention can be applied to the display device and to other signal control circuits. FIG. 24B is a rear type projector, and comprises a main body 2701, an optical light source system, a display device 2702, a mirror 2703 and a screen 2704. The present invention can be applied to the display device and other signal control circuits.

Note that FIG. 24C is a drawing showing one example of the structure of the optical light source system and display devices 2601 and 2602 of FIGS. 24A and 24B. The optical light source system and display devices 2601 and 2702 comprise an optical light source system 2801, mirrors 2802 and 2804 to 2806, dichroic mirror 2803, a beam splitter 2807, a liquid crystal display device 2808, phase differentiating plate 2809 and an optical projection system 2810. The optical projection system 2810 is composed of a plurality of optical lenses. Though the present embodiment shows an example of triple stage, but there are no special limits and a single stage is acceptable, for example. Further, the operator may set optical systems such as optical lenses, film having polarizing function, film to regulate the phase difference, IR films, etc., suitably within the optical path shown by an arrow in FIG. 24C. In addition, FIG. 24D shows one example of the structure of the optical light source system 2801 of FIG. 24C. In the present embodiment, the optical light source system 2801 comprises a reflector 2811, light source 2812, lens arrays 2813 and 2814, a polarizing conversion element 2815 and a condensing lens 2816. Note that the optical light source shown in FIG. 24D is merely an example and is not specifically limited to this structure.

Further, though not shown here, it is possible to apply the present invention to navigation systems and reading circuit of the image sensor, other than stated here. As shown above, the applicable range of the present invention is extremely wide, and it is possible to apply the present invention to electronic equipment in all fields. Further, an electronic device of the present invention can be realized by using structure of any combination of embodiments 1 to 10.

By using the present invention, it becomes possible to dispose TFTs having appropriate performance in accordance with the required specifications of each functional circuit in the semiconductor device (electro-optical devices in concrete here) in which a plurality of functional circuit are formed over a same substrate, and the operation characteristics and reliability can be greatly improved.

Further, the operation performance and the reliability of the semiconductor device (electronic machines in concrete here) having such electrooptical devices as display medium can be improved at the same time.

What is claimed is:

1. A semiconductor device comprising a pixel section and a driver circuit provided in a peripheral of the pixel section provided over a same substrate wherein the pixel section and the driver circuit comprise at least an n-channel TFT comprising:
   an active layer;
   an LDD region provided in the active layer;
   a gate insulating film provided between the active layer and the substrate; and
   a gate electrode provided between the gate insulating film and the substrate,
   wherein the semiconductor device is characterized in that:
      at least a portion or all of a LDD region of the n-channel TFT of the pixel section is disposed so as to overlap the gate electrode of the pixel section;
      a LDD region of the n-channel TFT of the driving circuit is disposed so as to overlap the gate electrode of the n-channel TFT of the driving circuit; and
      an impurity element imparting n-type is included in the LDD region of the n-channel TFT of the driving circuit at a higher concentration than that included in the LDD region of the n-channel TFT of the pixel section.

2. A semiconductor device comprising a pixel section and a driver circuit provided in its peripheral provided over a same substrate, comprising at least an n-channel TFT comprising:
   an active layer;
   an LDD region provided in the active layer;
   a gate insulating film provided between the active layer and the substrate;
   a gate electrode provided between the gate insulating film and the substrate,
   wherein the semiconductor device is characterized in that:
      at least a portion or all of a LDD region of the n-channel TFT of the pixel section is disposed so as to overlap the gate electrode of the pixel section;
      at least a portion or all of a LDD region of the n-channel TFT of the driving circuit is disposed so as to overlap the gate electrode of the n-channel TFT of the driving circuit; and
      an impurity element imparting n-type is included in the LDD region of the n-channel TFT of the driving circuit at a higher concentration than that included in the the LDD region of the n-channel TFT of the pixel section.

3. A semiconductor device comprising a pixel section and a driver circuit provided in its peripheral provided over a same substrate, comprising at least a n-channel TFT comprising:
   an active layer;
   an LDD region provided in the active layer;
   a gate insulating film provided between the active layer and the substrate; and
   a gate electrode provided between the gate insulating film and the substrate,
   wherein the semiconductor device is characterized in that:
      a first LDD region of the n-channel TFT of the pixel section is disposed so as to overlap the gate electrode of the pixel section;
      a second LDD region of the n-channel TFT of the pixel section is disposed so as not to overlap the gate electrode of the pixel section;
      at least a portion or all of a LDD region of the n-channel TFT of the driving circuit is disposed so as to overlap the gate electrode of the n-channel TFT of the driving circuit; and
      an impurity element imparting n-type is included in the LDD region of the n-channel TFT of the driving circuit at a higher concentration than that included in the the LDD region of the n-channel TFT of the pixel section.

4. A semiconductor device comprising a pixel section and a driver circuit provided in its peripheral over a same substrate comprising at least an n-channel TFT comprising:
   an active layer;
   an LDD region provided in the active layer;
   a gate insulating film provided between the active layer and the substrate; and
   a gate electrode provided between the gate insulating film and the substrate,
   wherein the semiconductor device is characterized in that:
      a LDD region of the n-channel TFT of the pixel section is disposed so as to overlap the gate electrode of the pixel section;
      a LDD region of the n-channel TFT of the driving circuit is disposed so as to overlap the gate electrode of the n-channel TFT of the driving circuit; and
      an impurity element imparting n-type is included in the LDD region of the n-channel TFT of the driving circuit at a higher concentration than that included in the the LDD region of the n-channel TFT of the pixel section.

5. A semiconductor device according to claim 1 wherein a storage capacitor of the pixel section comprises a semiconductor layer connected to the active layer, an insulating film provided between the semiconductor layer and the substrate, and a capacitance wiring provided between the insulating film and the substrate.

6. A semiconductor device according to claim 2 wherein a storage capacitor of the pixel section comprises a semiconductor layer connected to the active layer, an insulating film provided between the semiconductor layer and the substrate, and a capacitance wiring provided between the insulating film and the substrate.

7. A semiconductor device according to claim 3 wherein a storage capacitor of the pixel section comprises a semiconductor layer connected to the active layer, an insulating film provided between the semiconductor layer and the substrate, and a capacitance wiring provided between the insulating film and the substrate.

8. A semiconductor device according to claim 1 wherein an impurity element imparting n-type is included in the LDD region of the n-channel TFT of the driving circuit at a concentration higher by 2 times or more and less than 10 times compared to that included in the LDD region of the n-channel TFT of the pixel section.

9. A semiconductor device according to claim 2 wherein an impurity element imparting n-type is included in the LDD region of the n-channel TFT of the driving circuit at a concentration higher by 2 times or more and less than 10 times compared to that included in the LDD region of the n-channel TFT of the pixel section.

10. A semiconductor device according to claim 4 wherein an impurity element imparting n-type is included in the LDD region of the n-channel TFT of the driving circuit at a concentration higher by 2 times or more and less than 10 times compared to that included in the LDD region of the n-channel TFT of the pixel section.

11. A semiconductor device according to claim 1 wherein an impurity element imparting n-type is included in the LDD region of the n-channel TFT of the driving circuit and the second LDD region of the n-channel TFT of the pixel section at a concentration higher by 2 times or more and less than 10 times compared to that included in the first LDD region of the n-channel TFT of the pixel section.

12. A semiconductor device according to claim 1 wherein the semiconductor device is used in one selected from a group consisting of a portable telephone, a video camera, a mobile computer, a goggle type display, a projector, a portable book, a digital camera, a car navigation system and a personal computer.

13. A semiconductor device according to claim 2 wherein the semiconductor device is used in one selected from a group consisting of a portable telephone, a video camera, a mobile computer, a goggle type display, a projector, a portable book, a digital camera, a car navigation system and a personal computer.

14. A semiconductor device according to claim 3 wherein the semiconductor device is used in one selected from a group consisting of a portable telephone, a video camera, a mobile computer, a goggle type display, a projector, a portable book, a digital camera, a car navigation system and a personal computer.

15. A semiconductor device according to claim 4 wherein the semiconductor device is used in one selected from a group consisting of a portable telephone, a video camera, a mobile computer, a goggle type display, a projector, a portable book, a digital camera, a car navigation system and a personal computer.

16. A method for manufacturing a semiconductor device comprising a pixel section and a driver circuit provided in its peripheral over a same substrate comprising the steps of:
   forming an n-channel TFT in the pixel section and the driver circuit, which comprises an active layer, an LDD region provided in the active layer, a gate insulating film provided between the active layer and the substrate, a gate electrode provided between the gate insulating film and the substrate;
   wherein the semiconductor device is characterized in that:
      at least a portion or all of a LDD region of the n-channel TFT of the pixel section is disposed so as to overlap the gate electrode of an n-channel TFT of the pixel section;
      a LDD region of the n-channel TFT of the driving circuit is disposed so as to overlap the gate electrode of the n-channel TFT of the driving circuit; and
      an impurity element imparting n-type is included in the LDD region of the n-channel TFT of the driving circuit at a higher concentration than that included in the LDD region of the n-channel TFT of the pixel section.

17. A method for manufacturing a semiconductor device comprising a pixel section and a driver circuit provided in its peripheral over a same substrate, comprising the steps of:
   forming a n-channel TFT in the pixel section and the driver circuit, comprising an active layer, an LDD region provided in the active layer, a gate insulating film provided between the active layer and the substrate, a gate electrode provided between the gate insulating film and the substrate,
   wherein the semiconductor device is characterized in that:
      at least a portion or all of a LDD region of the n-channel TFT of the pixel section is disposed so as to overlap the gate electrode of an n-channel TFT of the pixel section;
      at least a portion or all of a LDD region of the n-channel TFT of the driving circuit is disposed so as to overlap the gate electrode of the n-channel TFT of the driving circuit; and
      an impurity element imparting n-type is included in the LDD region of the n-channel TFT of the driving circuit at a higher concentration than that included in the the LDD region of the n-channel TFT of the pixel section.

18. A method for manufacturing a semiconductor device comprising a pixel section and a driver circuit provided in its peripheral over a same substrate, comprising the steps of:
   forming an n-channel TFT in the pixel section and the driver circuit, comprising an active layer, a LDD region provided in the active layer, a gate insulating film provided between the active layer and the substrate, a gate electrode provided between the gate insulating film and the substrate,
   wherein the semiconductor device is characterized in that:
      a first LDD region of the n-channel TFT of the pixel section is disposed so as to overlap the gate electrode of an n-channel TFT of the pixel section;
      a second LDD region of the n-channel TFT of the pixel section is disposed so as not to overlap the gate electrode of an n-channel TFT of the pixel section;
      at least a portion or all of a LDD region of the n-channel TFT of the driving circuit is disposed so as to overlap the gate electrode of the n-channel TFT of the driving circuit; and
      an impurity element imparting n-type is included in the LDD region of the n-channel TFT of the driving circuit and the second LDD region of the n-channel TFT of the pixel section at a higher concentration than that included in the first LDD region of the n-channel TFT of the pixel section.

19. A method for manufacturing a semiconductor device comprising a pixel section and a driver circuit provided in its peripheral provided over a same substrate, comprising the steps of:
   forming a n-channel TFT in the pixel section and the driver circuit which comprises an active layer, a LDD region provided in the active layer, a gate insulating film provided between the active layer and the substrate, a gate electrode provided between the gate insulating film and the substrate, wherein the semiconductor device is characterized in that:
- a LDD region of the n-channel TFT of the pixel section is disposed so as to overlap the gate electrode of an n-channel TFT of the pixel section;
- a LDD region of the n-channel TFT of the driving circuit is disposed so as to overlap the gate electrode of the n-channel TFT of the driving circuit; and
- an impurity element imparting n-type is included in the LDD region of the n-channel TFT of the driving circuit at a higher concentration than that included in the the LDD region of the n-channel TFT of the pixel section.

20. A method for manufacturing a semiconductor device according to claim 16 further comprising a step of forming a storage capacitor in the pixel section which comprises a semiconductor layer connected to the active layer, an insulating film provided between the semiconductor layer and the substrate, and a capacitance wiring provided between the insulating film and the substrate.

21. A method for manufacturing a semiconductor device according to claim 17 further comprising a step of forming a storage capacitor in the pixel section which comprises a semiconductor layer connected to the active layer, an insulating film provided between the semiconductor layer and the substrate, and a capacitance wiring provided between the insulating film and the substrate.

22. A method for manufacturing a semiconductor device according to claim 18 further comprising a step of forming a storage capacitor in the pixel section which comprises a semiconductor layer connected to the active layer, an insulating film provided between the semiconductor layer and the substrate, and a capacitance wiring provided between the insulating film and the substrate.

23. A method for manufacturing a semiconductor device according to claim 16 wherein an impurity element imparting n-type is included in the LDD region of the n-channel TFT of the driving circuit at a concentration higher by 2 times or more and less than 10 times compared to that included in the LDD region of the n-channel TFT of the pixel section.

24. A method for manufacturing a semiconductor device according to claim 17 wherein an impurity element imparting n-type is included in the LDD region of the n-channel TFT of the driving circuit at a concentration higher by 2 times or more and less than 10 times compared to that included in the LDD region of the n-channel TFT of the pixel section.

25. A method for manufacturing a semiconductor device according to claim 19 wherein an impurity element imparting n-type is included in the LDD region of the n-channel TFT of the driving circuit at a concentration higher by 2 times or more and less than 10 times compared to that included in the LDD region of the n-channel TFT of the pixel section.

26. A method for manufacturing a semiconductor device according to claim 18 wherein an impurity element imparting n-type is included in the LDD region of the n-channel TFT of the driving circuit and the second LDD region of the n-channel TFT of the pixel section at a concentration higher by 2 times or more and less than 10 times compared to that included in the first LDD region of the n-channel TFT of the pixel section.

27. A method for manufacturing a semiconductor device according to claim 16 wherein the semiconductor device is used in one selected from a group consisting of a portable telephone, a video camera, a mobile computer, a goggle type display, a projector, a portable book, a digital camera, a car navigation system and a personal computer.

28. A method for manufacturing a semiconductor device according to claim 17 wherein the semiconductor device is used in one selected from a group consisting of a portable telephone, a video camera, a mobile computer, a goggle type display, a projector, a portable book, a digital camera, a car navigation system and a personal computer.

29. A method for manufacturing a semiconductor device according to claim 18 wherein the semiconductor device is used in one selected from a group consisting of a portable telephone, a video camera, a mobile computer, a goggle type display, a projector, a portable book, a digital camera, a car navigation system and a personal computer.

30. A method for manufacturing a semiconductor device according to claim 19 wherein the semiconductor device is used in one selected from a group consisting of a portable telephone, a video camera, a mobile computer, a goggle type display, a projector, a portable book, a digital camera, a car navigation system and a personal computer.

* * * * *